US012796496B2

(12) United States Patent
Chun

(10) Patent No.: US 12,796,496 B2
(45) Date of Patent: Nov. 10, 2026

(54) SEMICONDUCTOR PACKAGE

(71) Applicant: Samsung Electronics Co., Ltd., Suwon-si (KR)

(72) Inventor: Jinho Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 295 days.

(21) Appl. No.: 18/630,122

(22) Filed: Apr. 9, 2024

(65) Prior Publication Data

US 2024/0347437 A1 Oct. 17, 2024

(30) Foreign Application Priority Data

Apr. 11, 2023 (KR) ........................ 10-2023-0047595

(51) Int. Cl.
*H10W 70/63* (2026.01)
*H10W 70/65* (2026.01)
(Continued)

(52) U.S. Cl.
CPC ......... *H10W 70/635* (2026.01); *H10W 70/65* (2026.01); *H10W 70/655* (2026.01);
(Continued)

(58) Field of Classification Search
CPC . H10W 70/635; H10W 70/65; H10W 70/685; H10W 74/117; H10W 90/00; H10W 90/24; H10W 90/724; H10W 90/752; H10W 90/754; H10W 70/60; H10W 90/722; H10W 70/614; H10W 90/701; H10W 70/655; H10W 70/656; H10W 70/69; H10P 72/7424; H10P 72/74; H01L 25/105; H01L 25/0657;
(Continued)

(56) References Cited

U.S. PATENT DOCUMENTS 6,407,341 B1 * 6/2002 Anstrom .............. H05K 3/4641 257/E23.079
6,815,837 B2 * 11/2004 Alcoe .................... H05K 1/113 257/784

(Continued)

*Primary Examiner* — Earl N Taylor
(74) *Attorney, Agent, or Firm* — Wolf, Greenfield & Sacks, P.C.

(57) ABSTRACT

A semiconductor package includes a redistribution substrate including a plurality of redistribution layers in an insulating layer and including an upper redistribution and a lower redistribution layer, a first pad structure; a second pad structure on the redistribution substrate and connected to the upper redistribution layer; a through-via extending to electrically connect the second pad structure and the plurality of redistribution layers; and a semiconductor chip, wherein the upper redistribution layer includes an upper pattern portion, a first upper pad portion connected to the first pad structure, and a second pad portion having an upper hole through which the through-via extends, the lower redistribution layer includes a lower pattern portion and a lower pad portion on at least one end of the lower pattern portion and having a lower hole through which the through-via extends, and the second pad structure includes a through-hole through which the through-via extends.

20 Claims, 18 Drawing Sheets

A

(51) Int. Cl.

*H10W 70/655* (2026.01)
*H10W 70/656* (2026.01)
*H10W 70/685* (2026.01)
*H10W 74/10* (2026.01)
*H10W 90/00* (2026.01)
*H10W 90/24* (2026.01)

(52) U.S. Cl.

CPC ....... *H10W 70/656* (2026.01); *H10W 70/685* (2026.01); *H10W 74/117* (2026.01); *H10W 90/00* (2026.01); *H10W 90/24* (2026.01); *H10W 90/724* (2026.01); *H10W 90/752* (2026.01); *H10W 90/754* (2026.01)

(58) Field of Classification Search

CPC ........... H01L 23/5389; H01L 23/49894; H01L 23/49827; H01L 23/49838; H01L 23/49822; H01L 23/49816; H01L 23/3128

See application file for complete search history.

(56) References Cited

U.S. PATENT DOCUMENTS

| | | | | |
|---|---|---|---|---|
| 6,848,177 | B2 * | 2/2005 | Swan | H10W 20/023 257/E21.597 |
| 8,531,009 | B2 * | 9/2013 | Lin | H10W 20/023 257/773 |
| 10,580,726 | B2 | 3/2020 | Chun et al. | |
| 11,088,068 | B2 | 8/2021 | Kuo et al. | |
| 11,158,579 | B2 | 10/2021 | Lee et al. | |
| 11,289,426 | B2 | 3/2022 | Chu et al. | |
| 11,387,192 | B2 | 7/2022 | Kim | |
| 12,512,400 | B2 * | 12/2025 | Lee | H10B 80/00 |
| 2003/0210534 | A1 * | 11/2003 | Swan | H10W 20/023 257/E21.597 |
| 2004/0238970 | A1 * | 12/2004 | Alcoe | H05K 1/113 257/E23.068 |
| 2006/0278979 | A1 * | 12/2006 | Rangel | H10D 62/117 257/734 |
| 2010/0090338 | A1 * | 4/2010 | Lee | H10W 20/023 257/E21.585 |
| 2014/0264839 | A1 | 9/2014 | Tsai et al. | |
| 2020/0168518 | A1 | 5/2020 | Lee et al. | |
| 2022/0115350 | A1 * | 4/2022 | Mun | H10P 72/74 |
| 2022/0367327 | A1 * | 11/2022 | Kang | H10W 70/093 |
| 2023/0083493 | A1 * | 3/2023 | Shin | H10P 72/74 257/787 |
| 2023/0386949 | A1 * | 11/2023 | Park | H10P 72/74 |
| 2024/0021530 | A1 * | 1/2024 | Jeon | H10B 80/00 |
| 2024/0136272 | A1 * | 4/2024 | Lee | H10B 80/00 |
| 2024/0234286 | A9 * | 7/2024 | Lee | H10B 80/00 |
| 2024/0332157 | A1 * | 10/2024 | Baek | H10P 72/74 |

* cited by examiner

A

B

SEMICONDUCTOR PACKAGE

CROSS-REFERENCE TO RELATED APPLICATION(S)

This application claims benefit of priority to Korean Patent Application No. 10-2023-0047595 filed on Apr. 11, 2023, in the Korean Intellectual Property Office, the disclosure of which is incorporated herein by reference in its entirety.

BACKGROUND

The present inventive concept relates to a semiconductor package.

A semiconductor package may be implemented with a semiconductor chip such as an integrated circuit to be suitable for use in an electronic product. With the recent development of the electronics industry, semiconductor packages are developing in various directions with the goal of miniaturization, reductions in weight, and reduction in manufacturing costs.

A semiconductor package may be manufactured by forming a redistribution substrate having a redistribution layer in advance, and mounting and molding a semiconductor chip on the redistribution substrate. The redistribution substrate may be formed by repeatedly performing a process of forming an insulating layer and patterning each redistribution layer on each insulating layer. As the pattern forming process may be repeatedly performed, undulations may be problematic.

SUMMARY

An aspect of the present inventive concept is to provide a semiconductor package having improved reliability by improving undulations generated by a step difference of each layer in a redistribution substrate.

According to an aspect of the present inventive concept, a semiconductor package includes a redistribution substrate having an upper surface and an opposing lower surface, the redistribution substrate including a plurality of redistribution layers in an insulating layer, the plurality of redistribution layers including an upper redistribution layer adjacent to the upper surface and a lower redistribution layer below the upper redistribution layer; a first pad structure on the upper surface of the redistribution substrate and connected to one side of the upper redistribution layer; a second pad structure on the upper surface of the redistribution substrate and connected to another side of the upper redistribution layer; a through-via extending from the upper surface to the lower surface of the redistribution substrate electrically and connecting the second pad structure and the plurality of redistribution layers; and a semiconductor chip on the redistribution substrate and electrically connected to the first pad structure, wherein the upper redistribution layer includes an upper pattern portion, a first upper pad portion connected to the first pad structure on a first end of the upper pattern portion, and a second upper pad portion connected to a second end of the upper pattern portion and having an upper hole through which the through-via extends, the lower redistribution layer includes a lower pattern portion and a lower pad portion on at least one end of the lower pattern portion and having a lower hole through which the through-via extends, and the second pad structure includes a through-hole aligned with the upper hole and the lower hole in a vertical direction and through which the through-via extends.

In addition, according to an aspect of the present inventive concept, a semiconductor package includes a redistribution substrate having an upper surface and an opposing lower surface, the redistribution substrate including external redistribution layers and internal redistribution layers; a semiconductor chip on the upper surface of the redistribution substrate and electrically connected to the external redistribution layers and the internal redistribution layers; a pad structure on the upper surface of the redistribution substrate and spaced apart from the semiconductor chip, the pad structure being electrically connected to the external redistribution layers; a through-via vertically extending through the pad structure and the external redistribution layers; and an encapsulant on at least a portion of the semiconductor chip, at least a portion of the pad structure, and at least a portion of the through-via on the upper surface of the redistribution substrate.

In addition, according to an aspect of the present inventive concept, a semiconductor package includes a redistribution substrate including a plurality of redistribution layers; a semiconductor chip on the redistribution substrate and electrically connected to the plurality of redistribution layers; a pad structure on the redistribution substrate spaced apart from the semiconductor chip; and a through-via including a conductive electrode in an etched region extending through both the pad structure and the plurality of redistribution layers, and a barrier layer on a side surface of the conductive electrode, wherein a width of an upper portion of the through-via is substantially equal to a width of a lower portion of the through-via.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, with reference to the accompanying drawings, preferred embodiments will be described as follows.

Figure 1A:
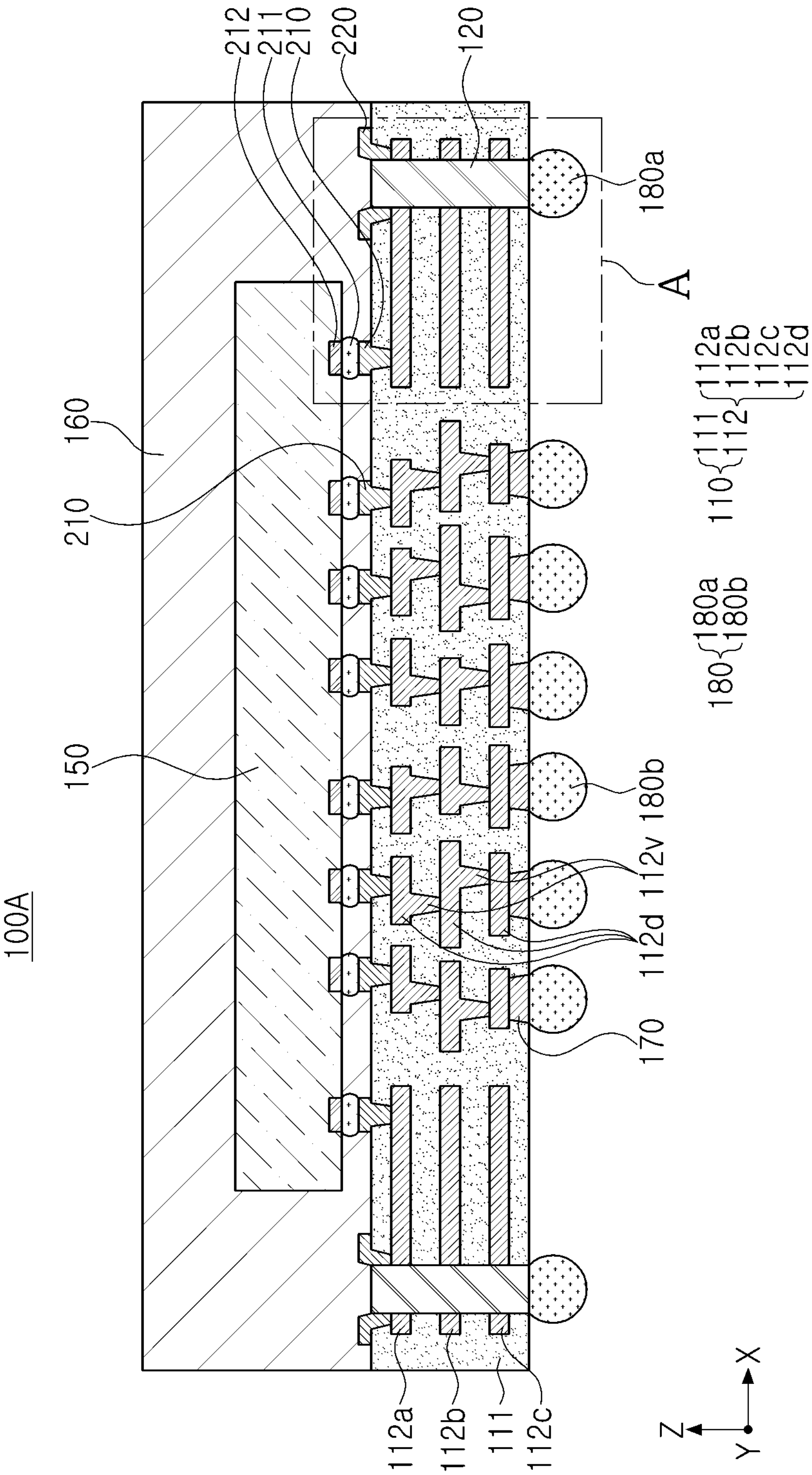
FIG. 1A is a cross-sectional view illustrating a semiconductor package according to an embodiment.
Figure 1B:
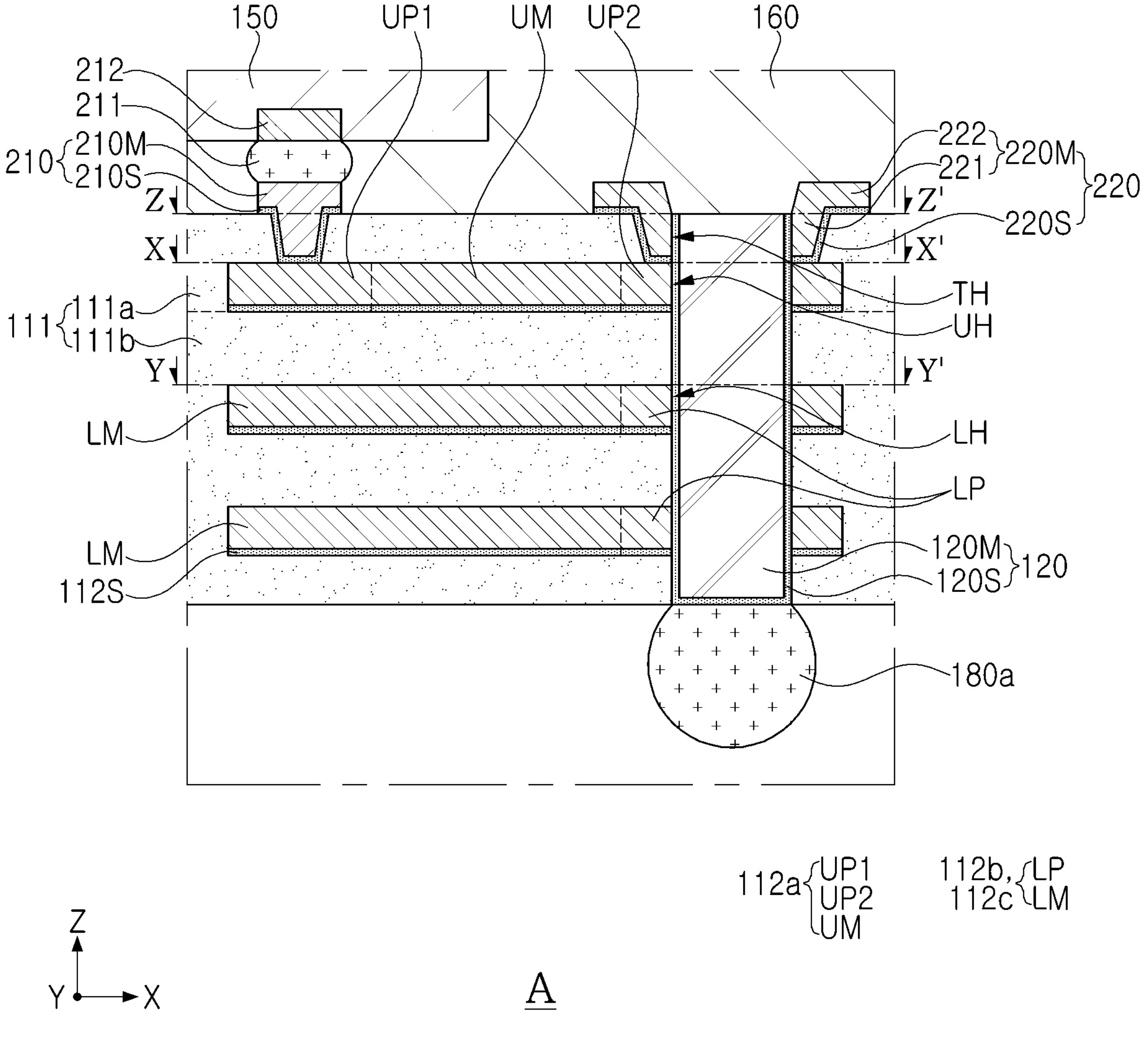
FIG. 1B is a partially enlarged view illustrating portion 'A' of FIG. 1A.

FIG. 1A is a cross-sectional view illustrating a semiconductor package 100A according to an embodiment, and FIG. 1B is a partially enlarged view illustrating portion 'A' of FIG. 1A.

Figure 2A:
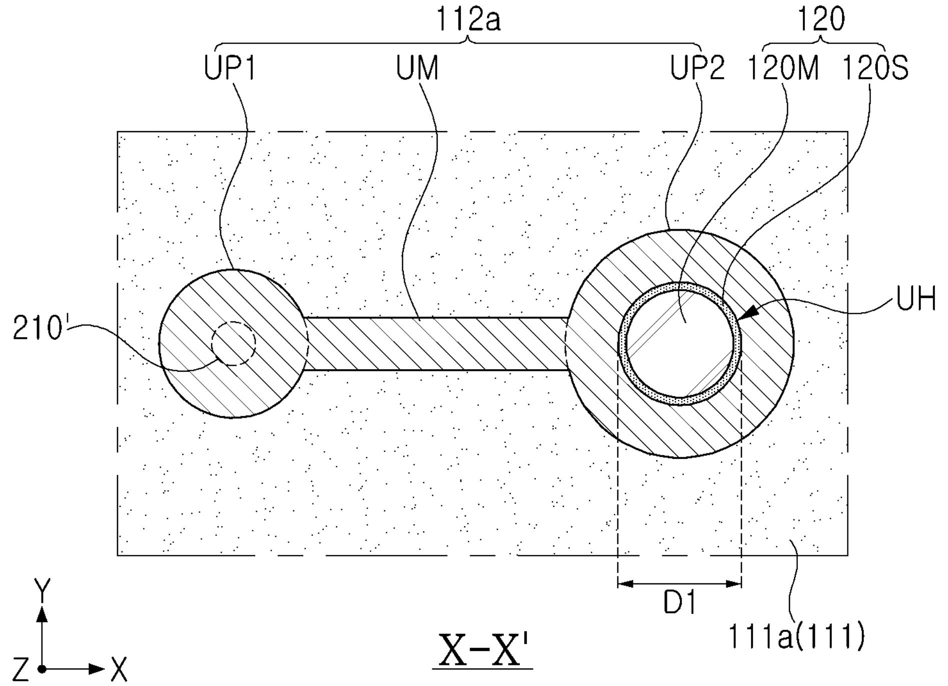
FIG. 2A is a plan view illustrating a cross-section of FIG. 1B, taken along line X-X'.
Figure 2B:
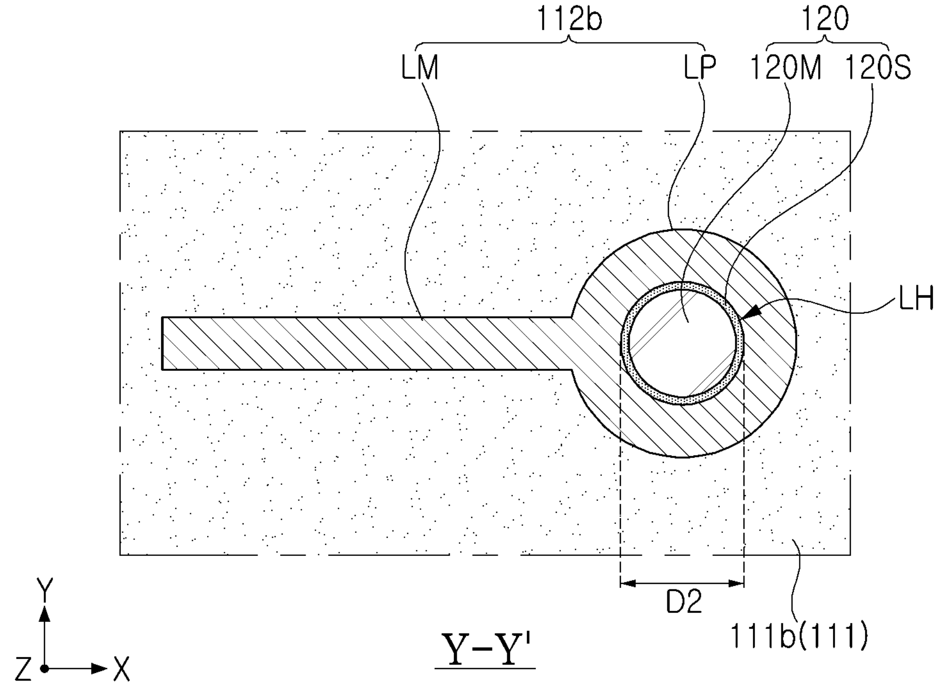
FIG. 2B is a plan view illustrating a cross-section of FIG. 1B, taken along line Y-Y'.
Figure 2C:
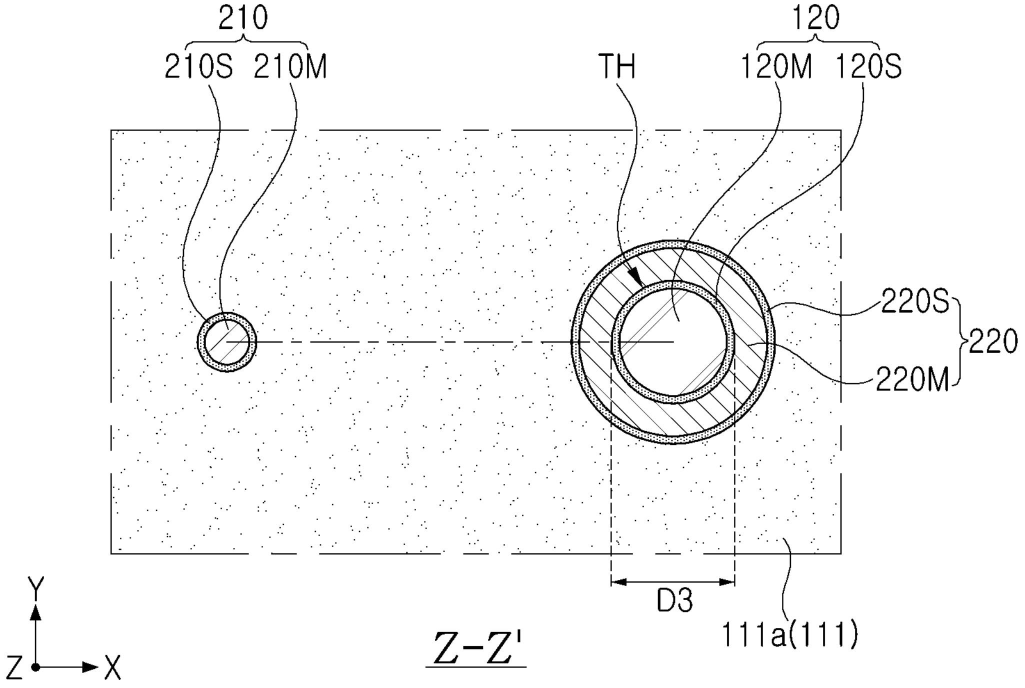
FIG. 2C is a plan view illustrating a cross-section of FIG. 1B, taken along line Z-Z'.

FIG. 2A is a plan view illustrating a cross-section of FIG. 1B, taken along line X-X', FIG. 2B is a plan view illustrating a cross-section of FIG. 1B, taken along line Y-Y', and FIG. 2C is a plan view illustrating a cross-section of FIG. 1B, taken along line Z-Z'.

Referring to FIGS. 1A and 1B, a semiconductor package 100A according to an embodiment may include a redistribution substrate 110, a first pad structure 210, a second pad structure 220, and a through-via 120. In addition, the semiconductor package 100A may further include a semiconductor chip 150, an encapsulant 160, lower pad structures 170, and connection bumps 180.

According to an example embodiment, the through-via 120 extending through and electrically connecting a plurality of redistribution layers 112 may be introduced in a portion of the redistribution substrate 110, to minimize a step difference due to undulations of each layer generated in a process of forming an insulating layer 111 and the plurality of redistribution layers 112, and to improve reliability.

To form a via electrically connecting a plurality of redistribution layers located on different levels in a semiconductor package structure, a via hole region may be formed in insulating layers located on different levels, and a plating process for filling the via hole region with a metal material may be performed. A metal pattern exposed to the via hole region may be corroded or oxidized by other chemicals. In addition, a step difference in a pattern formed in the via hole region may cause undulations of each layer. As processes of stacking redistribution patterns are repeated, undulations may be intensified to generate defects in connection and signal transmission of each layer.

According to an example embodiment, the above-mentioned technical problems may be improved by forming the through-via 120 extending through all of the plurality of redistribution layers 112 in a portion (e.g., a fan-out region) of the redistribution substrate 110. Hereinafter, each component of the semiconductor package 100A will be described in detail.

The redistribution substrate 110 may be a support substrate on which the semiconductor chip 150 is mounted, may have an upper surface and a lower surface opposing each other, and may include an insulating layer 111, and a plurality of redistribution layers 112 including an upper redistribution layer 112*a*, and lower redistribution layers (112*b* and 112*c*) below the upper redistribution layer 112*a*.

The insulating layer 111 may define the upper and lower surfaces of the redistribution substrate 110. The insulating layer 111 may be formed to surround (e.g. to be on side surfaces of and/or top and bottom surfaces of) at least a portion of the plurality of redistribution layers 112. The insulating layer 111 may include a plurality of layers stacked in a vertical direction (a Z-axis direction). The insulating layer 111 may be divided into an uppermost insulating layer 111*a* and an internal insulating layer 111*b* below the uppermost insulating layer 111*a*, according to a level to be located. Depending on a process, boundaries between the plurality of layers 111*a* and 111*b* may be unclear. The uppermost insulating layer 111*a* and the internal insulating layer 111*b* may include different materials. Specifically, the uppermost insulating layer 111*a* may include a photosensitive resin such as a photoimageable dielectric (PID). The internal insulating layer 111*b* may include a non-photosensitive resin. The non-photosensitive resin may include a thermosetting resin such as an epoxy resin, a thermoplastic resin such as polyimide, or a resin impregnated with an inorganic filler in these resins, for example, a prepreg, an Ajinomoto build-up film (ABF), FR-4, BT, or the like.

The plurality of redistribution layers 112 may include an upper redistribution layer 112*a* and at least one lower redistribution layer (112*b* and 112*c*), located on different levels. The plurality of redistribution layers 112 may include, for example, a metal material including copper (Cu), aluminum (Al), silver (Ag), tin (Sn), gold (Au), nickel (Ni), lead (Pb), titanium (Ti), or an alloy thereof. The plurality of redistribution layers 112 may perform various functions according to a design. For example, the plurality of redistribution layers 112 may include a ground pattern, a power pattern, and a signal pattern. For example, the upper redistribution layer 112*a* and the at least one lower redistribution layer (112*b* and 112*c*) to be described later may include at least one of the ground pattern or the power pattern. The plurality of redistribution layers 112 may further include a redistribution via 112*v* for electrically connecting adjacent redistribution layers, and the redistribution via 112*v* may have a shape tapered toward the lower surface of the redistribution substrate 110. A seed layer 112S for the plurality of redistribution layers 112 may be present on a lower end of the plurality of redistribution layers 112. The seed layer 112S may include a metal material such as titanium (Ti), a titanium (Ti) alloy, copper (Cu), a copper (Cu) alloy, or the like.

The plurality of redistribution layers 112 may include an external redistribution layer (112*a*, 112*b*, and 112*c*) and an internal redistribution layer 112*d*. The external redistribution layer (112*a*, 112*b*, and 112*c*) may be electrically connected to the through-via. The internal redistribution layer 112*d* may be spaced apart from the external redistribution layer (112*a*, 112*b*, and 112*c*) in a horizontal direction (an X-axis direction). The external redistribution layer (112*a*, 112*b*, and 112*c*) and the internal redistribution layer 112*d* may include the same material. The external redistribution layer (112*a*, 112*b*, and 112*c*) may be in a fan-out region, and the internal redistribution layer 112*d* may be in a fan-in region. For example, the external redistribution layer (112*a*, 112*b*, and 112*c*) may extend outward from the semiconductor chip 150, and the internal redistribution layer 112*d* may be under the semiconductor chip 150. The internal redistribution layer 112*d* may extend from a region, not illustrated in FIG. 1A, to the fan-out region. For example, the internal redistribution layer 112*d* may redistribute a connection pad 212 of the semiconductor chip 150 to the fan-out region. In this case, the fan-in region refers to a region overlapping the semiconductor chip 150 vertically (the Z-direction), and the fan-out region refers to a region not overlapping the semiconductor chip 150.

Referring to FIG. 2A along with FIGS. 1A and 1B, the upper redistribution layer 112*a* may include a first upper pad portion UP1, an upper pattern portion UM, and a second upper pad portion UP2. One side end of the upper redistribution layer 112*a* may be the first upper pad portion UP1, and may have a circular cross-sectional shape. The first upper pad portion UP1 may have a contact region 210' with which the first pad structure 210 is in contact. The other side end of the upper redistribution layer 112*a* may be the second upper pad portion UP2, and may have a ring shape. An upper hole UH may exist in a central portion of the second upper pad portion UP2. A conductive electrode 120M and a barrier layer 120S may be present in the upper hole UH. A diameter of the second upper pad portion UP2 may be equal to or greater than a diameter of the first upper pad portion UP1.

In this case, 'equal' or 'same' or 'substantially the same' or "substantially equal' may include process errors or the like, and means that the diameter may not be intentionally designed to be different. The upper pattern portion UM may extend horizontally (the X- and/or Y-directions) between the first upper pad portion UP1 and the second upper pad portion UP2. The upper pattern portion UM may connect the first upper pad portion UP1 and the second upper pad portion UP2.

Referring to FIG. 2B along with FIGS. 1A and 1B, the lower redistribution layer 112*b* may include a lower pad portion LP and a lower pattern portion LM. One side end of the lower redistribution layer 112*b* may be the lower pad portion LP, and may have a ring shape. A lower hole LH may exist in a central portion of the lower pad portion LP. The conductive electrode 120M and the barrier layer 120S may exist in the lower hole LH. A diameter of the lower pad portion LP may be equal to that of the second upper pad portion UP2, and a diameter D2 of the lower hole LH may be equal to or shorter than a diameter D1 of the upper hole UH. In this case, 'equal' or 'same' may include process errors or the like, and means that the diameter may not be intentionally designed to be different. The lower pattern portion LM may extend horizontally (X- and/or Y-directions) from one side of the lower pad portion LP.

The second upper pad portion UP2 may be vertically aligned with the lower pad portion LP. The upper pattern portion UM may be vertically aligned with the lower pattern portion LM.

Referring to FIG. 2C along with FIGS. 1A and 1B, the first pad structure 210 may have a circular cross-section on the upper surface of the redistribution substrate 110. The first pad structure 210 may include a first plating layer 210M and a seed layer 210S surrounding or on a side surface of the first plating layer 210M. The second pad structure 220 may have a ring cross-section on the upper surface of the redistribution substrate 110. The second pad structure 220 may include a second plating layer 220M and a seed layer 220S surrounding or on a side surface of the second plating layer 220M. A through-hole TH may exist in in a central portion of a horizontal cross-section of the second pad structure 220. A diameter D3 of the through-hole TH may be equal to or greater than the diameter D1 of the upper hole UH and the diameter D2 of the lower hole LH. In this case, 'equal' or 'same' may include process errors or the like, and means that the diameter may not be intentionally designed to be different. An internal side of the second pad structure 220 may be filled with the barrier layer 120S and the conductive electrode 120M in sequence. All of the aforementioned seed layers may contain the same material.

The through-via 120 may pass vertically through the plurality of redistribution layers 112, and may electrically connect the plurality of redistribution layers 112 to each other. The through-via 120 may include a conductive electrode 120M and a barrier layer 120S surrounding or on a side surface of the conductive electrode 120M. The conductive electrode 120M and the barrier layer 120S may include a metal material including copper (Cu), aluminum (Al), silver (Ag), tin (Sn), gold (Au), nickel (Ni), lead (Pb), titanium (Ti)), or an alloy thereof. For example, the barrier layer 120S may include at least one of titanium (Ti), a titanium (Ti) alloy, copper (Cu), or a copper (Cu) alloy, and the conductive electrode 120M may include at least one of copper (Cu) or a copper (Cu) alloy. In the through-via 120, a width of a region ('a first region') contacting the internal insulating layer 111*b* below the upper redistribution layer 112*a* may be equal to a width of a region ('a second region') contacting the internal insulating layer 111*b* below the lower redistribution layer 112*b*. The width of 'the first region' may be equal to a width of the upper hole UH, and the width of 'the second region' may be equal to a width of the lower hole LH.

A plurality of lower pad structures 170 may be below a lowermost redistribution layer of the internal redistribution layers 112*d*. The plurality of lower pad structures 170 may be electrically connected to the internal redistribution layers 112*d*. Lower surfaces of the plurality of lower pad structures 170 may be exposed from the insulating layer 111. The plurality of lower pad structures 170 may include the same material as the plurality of redistribution layers 112.

The connection bumps 180 may be on the lower surface of the redistribution substrate 110. The connection bumps 180 may include a first connection bump 180*a* and a second connection bump 180*b*, electrically connected to the plurality of redistribution layers 112. Specifically, the first connection bump 180*a* may be electrically connected to the external redistribution layer (112*a*, 112*b*, and 112*c*), and the second connection bump 180*b* may be electrically connected to the internal redistribution layer 112*d*. The first connection bump 180*a* may be on a lower surface of the through-via 120. In an embodiment, the first connection bump 180*a* may be in contact with the lower surface of the through-via 120. The second connection bump 180*b* may be on a lower surface of a lower pad structure 170. The first connection bump 180*a* and the second connection bump 180*b* may be solder balls, for example. The first connection bump 180*a* and the second connection bump 180*b* may electrically connect the semiconductor package 100A to an external device (e.g., a motherboard). According to embodiments, a width of the first connection bump 180*a* may be equal to or wider than a width of the second connection bump 180*b*.

The semiconductor chip 150 may be on the upper surface of the redistribution substrate 110, and may include a connection pad 212 electrically connected to the redistribution layers 112. The semiconductor chip 150 may be an integrated circuit (IC) in a bare state in which a bump or a wiring layer is not formed, but is not limited thereto, and may be a packaged type integrated circuit. The integrated circuit may be a processor chip such as a central processor (CPU), a graphic processor (GPU), a field programmable gate array (FPGA), an application processor (AP), a digital signal processor, a cryptographic processor, a microprocessor, a microcontroller, or the like, but is not limited thereto, and may be a logic chip such as an analog-to-digital converter, an application-specific IC (ASIC), or the like, or a memory chip including a volatile memory such as a dynamic RAM (DRAM), a static RAM (SRAM), or the like, and a non-volatile memory such as a phase change RAM (PRAM), a magnetic RAM (MRAM), a resistive RAM (RRAM), a flash memory, or the like.

The connection pad 212 of the semiconductor chip 150 may be electrically connected to the first pad structure 210 through a solder portion 211. The solder portion 211 may be between the first pad structure 210 and the connection pad 212. Depending on an embodiment, a conductive pillar (not illustrated) may be between the solder portion 211 and the connection pad 212.

The first pad structure 210 may be on the upper surface of the redistribution substrate 110, and may be electrically connected to an uppermost redistribution layer (e.g., '112*a*') of the plurality of redistribution layers 112. A plurality of first pad structures 210 may be on the upper surface of the redistribution substrate 110. The plurality of first pad structures 210 may have the same shape and height. The first pad structure 210 may include a first plating layer 210M, and a seed layer 210S between the first plating layer 210M and the insulating layer 111 and between the first plating layer 210M and the upper redistribution layer 112*a*. The first pad structure 210 may include a via portion that directly contacts and electrically connects the uppermost redistribution layer, and a pad portion on an upper end of the via portion. A cross-section of the via portion may have a shape tapered toward the lower surface of the redistribution substrate 110. The uppermost redistribution layer may mean a redistribution layer located on the highest level of the internal redistribution layers 112*d*, and the upper redistribution layer 112*a* which may be the highest of the external redistribution layers.

The second pad structure 220 may be on the upper surface of the redistribution substrate 110, and spaced apart from the first pad structure 210 and the semiconductor chip 150 in a horizontal direction (e.g., the X-direction). The second pad structure 220 may contact the upper redistribution layer 112*a*. A height of the second pad structure 220 may be equal to a height of the first pad structure 210. Depending on an embodiment, a width of the second pad structure 220 may be wider than a width of the first pad structure 210. The second pad structure 220 may include a second plating layer 220M, and a seed layer 220S between the second plating layer 220M and the insulating layer 111 and between the second plating layer 220M and the upper redistribution layer 112*a*. The second plating layer 220M may include a first portion 221 extending vertically (the Z-direction) in the insulating layer 111, and a second portion 222 extending from the first portion 221 to the upper surface of the redistribution substrate 110. The first portion 221 may be located on a level, lower than the upper surface of the redistribution substrate 110. The second portion 222 may be located on a level, higher than the upper surface of the redistribution substrate 110. An internal side wall of the first portion 221 may have a shape, perpendicular to the upper surface of the redistribution substrate 110, and an internal side wall of the second portion 222 may have a shape inclined with respect to the upper surface of the redistribution substrate 110. That is, the internal side wall of the second portion 222 may be at an angle that is not perpendicular to (e.g., off-axis from) the upper surface of the redistribution substrate.

The encapsulant 160 may seal at least a portion of the semiconductor chip 150, at least a portion of the first pad structure 210, at least a portion of the second pad structure 220, and at least a portion of the through-via 120 on the upper surface of the redistribution substrate 110. The encapsulant 160 may be, for example, a thermosetting resin such as epoxy resin, a thermoplastic resin such as polyimide, or a prepreg impregnated with an inorganic filler in these resins, ABF, FR-4, BT, an epoxy molding compound (EMC). The encapsulant 160 may be in direct contact with the semiconductor chip 150, the first pad structure 210, the second pad structure 220, and the through-via 120 on the redistribution substrate 110. Specifically, the encapsulant 160 may be in direct contact with an upper surface of the first pad structure 210, an upper surface of the second pad structure 220, and an upper surface of the through-via 120.

FIGS. 3A to 3I are cross-sectional views of major processes illustrating a method of manufacturing a redistribution substrate according to an embodiment. The method may be a process of manufacturing the redistribution substrate 110 of the semiconductor package 100A of FIG. 1A, and can be understood as a process diagram of portion 'A' of FIG. 1A, i.e., a portion corresponding to FIG. 1B.

Figure 3A:
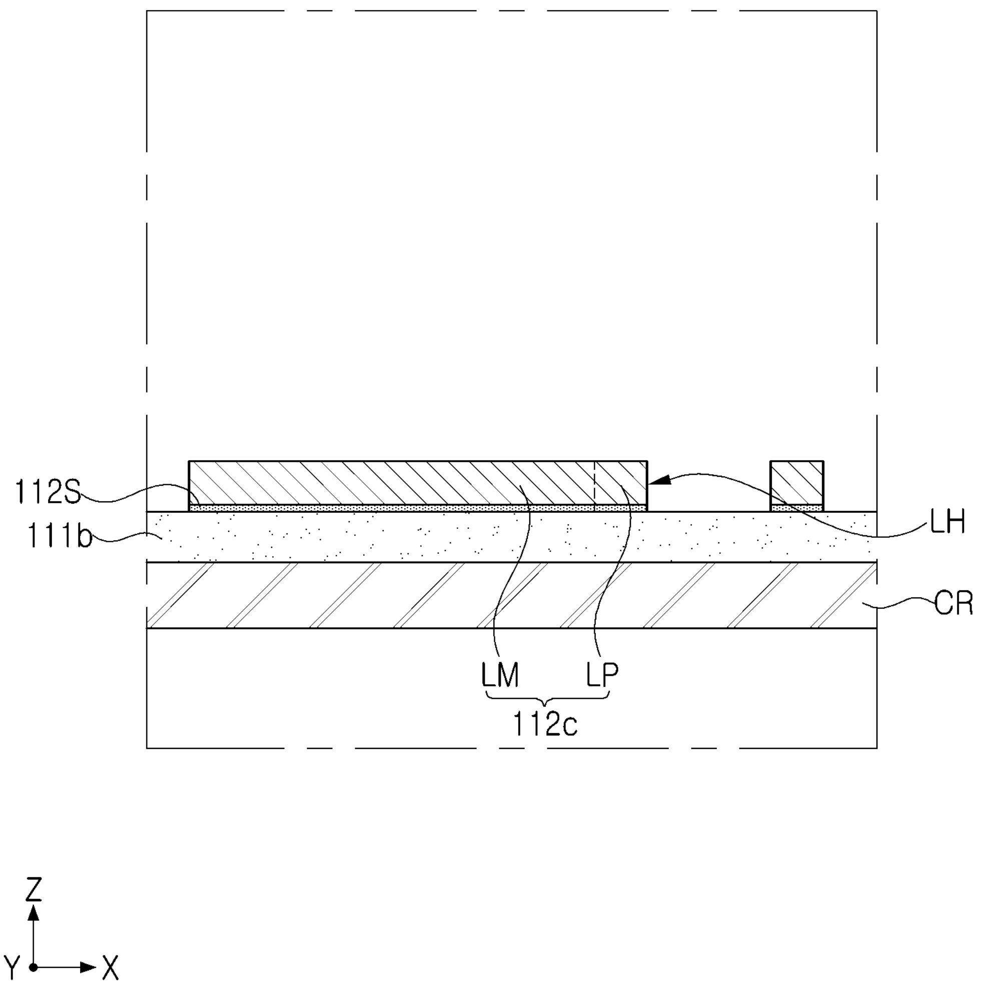
FIGS. 3A to 3I are cross-sectional views of major processes illustrating a method of manufacturing a redistribution substrate according to an embodiment.

Referring to FIG. 3A, an internal insulating layer 111*b* and a first lower redistribution layer 112*c* may be formed. A carrier CR may be provided as a substrate for building up a redistribution structure. The internal insulating layer 111*b* may be formed on the carrier CR. The internal insulating layer 111*b* may be formed by coating and curing an insulating resin. The insulating resin may include, for example, an Ajinomoto build-up film (ABF). In an embodiment, the internal insulating layer 111*b* may include a non-photosensitive insulating resin.

The first lower redistribution layer 112*c* may include a lower pattern portion LM and a lower pad portion LP. The first lower redistribution layer 112*c* may be formed by performing a plating process. A seed layer 112S for an electroplating process may be below the first lower redistribution layer 112*c*. The seed layer 112S may include titanium (Ti), a titanium (Ti) alloy, copper (Cu), a copper (Cu) alloy, or the like. The lower pad portion LP may be patterned in a ring cross-sectional shape having a lower hole LH.

The first lower redistribution layer 112*c* may have the same shape as the second lower redistribution layer 112*b* illustrated in FIG. 2B. The first lower redistribution layer 112*c* may include a lower pattern portion LM and a lower pad portion LP, having a ring cross-sectional shape having a lower hole LH therein.

Figure 3B:
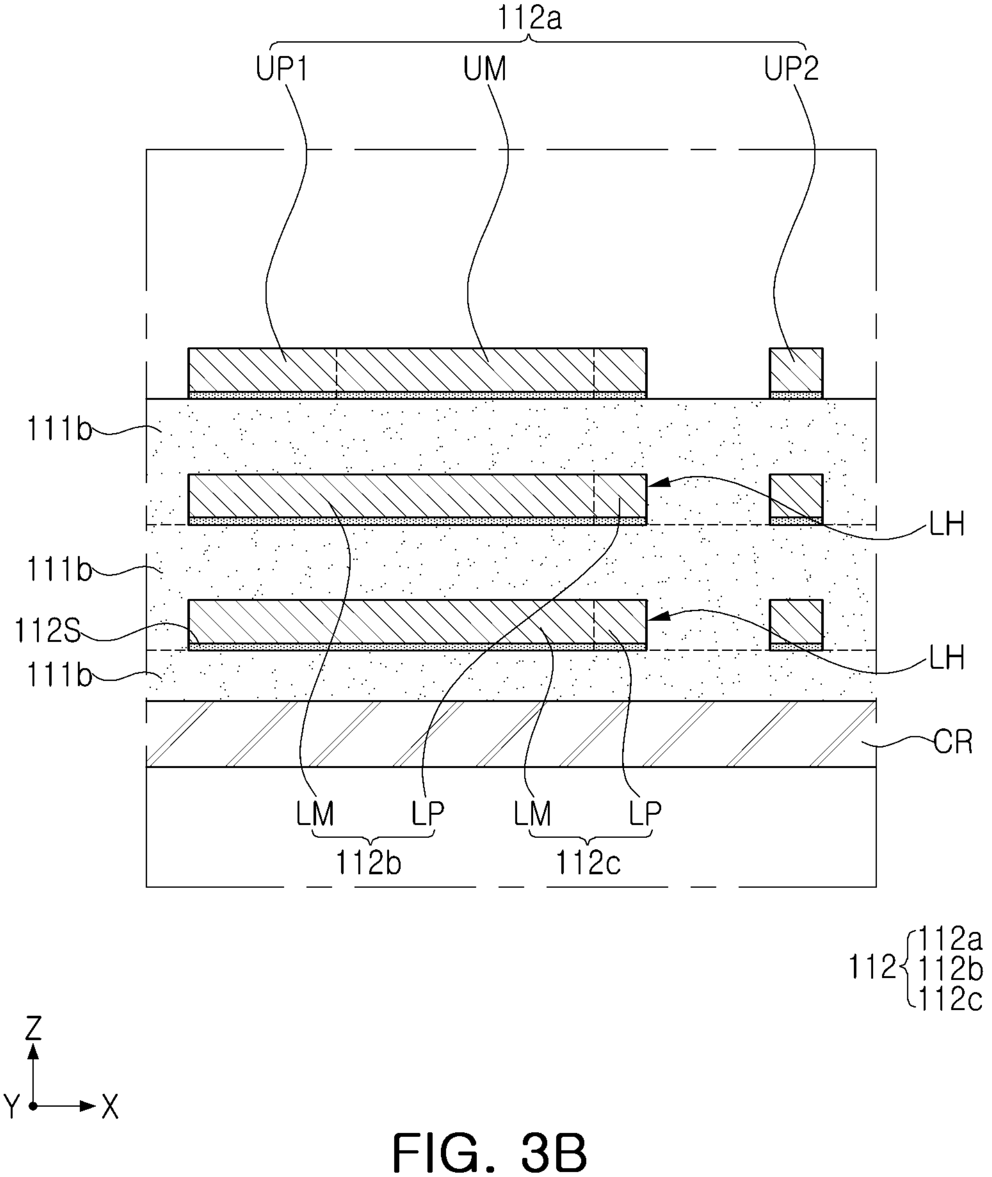

Referring to FIG. 3B, internal insulating layers 111*b*, a second lower redistribution layer 112*b*, and an upper redistribution layer 112*a* may be formed by repeating the above process. The internal insulating layers 111*b* may have a structure in which a plurality of insulating layers are stacked vertically (in the Z-axis direction). Depending on a process, a boundary between a plurality of layers may be unclear. In an embodiment, the internal insulating layers 111*b* may include a non-photosensitive insulating resin. The second lower redistribution layer 112*b* may include a lower pattern portion LM and a lower pad portion LP, and may have the same shape as the first lower redistribution layer 112*c*. The second lower redistribution layer 112*b* may include the same material as the first lower redistribution layer 112*c*. The second lower redistribution layer 112*b* may have a structure surrounded by (e.g. on side, bottom, or top surfaces of) the internal insulating layer 111*b*. The upper redistribution layer 112*a* may be formed on an upper surface of the internal insulating layer 111*b*. As illustrated in FIG. 2A, the upper redistribution layer 112*a* may include a first upper pad portion UP1, a second upper pad portion UP2, and an upper pattern portion UM. The upper redistribution layer 112*a* may include the same material as the lower redistribution layers 112*b* and 112*c*. The second lower redistribution layer 112*b* may be patterned to have lower holes LH, and the upper redistribution layer 112*a* may be patterned to have an upper hole UH.

Figure 3C:
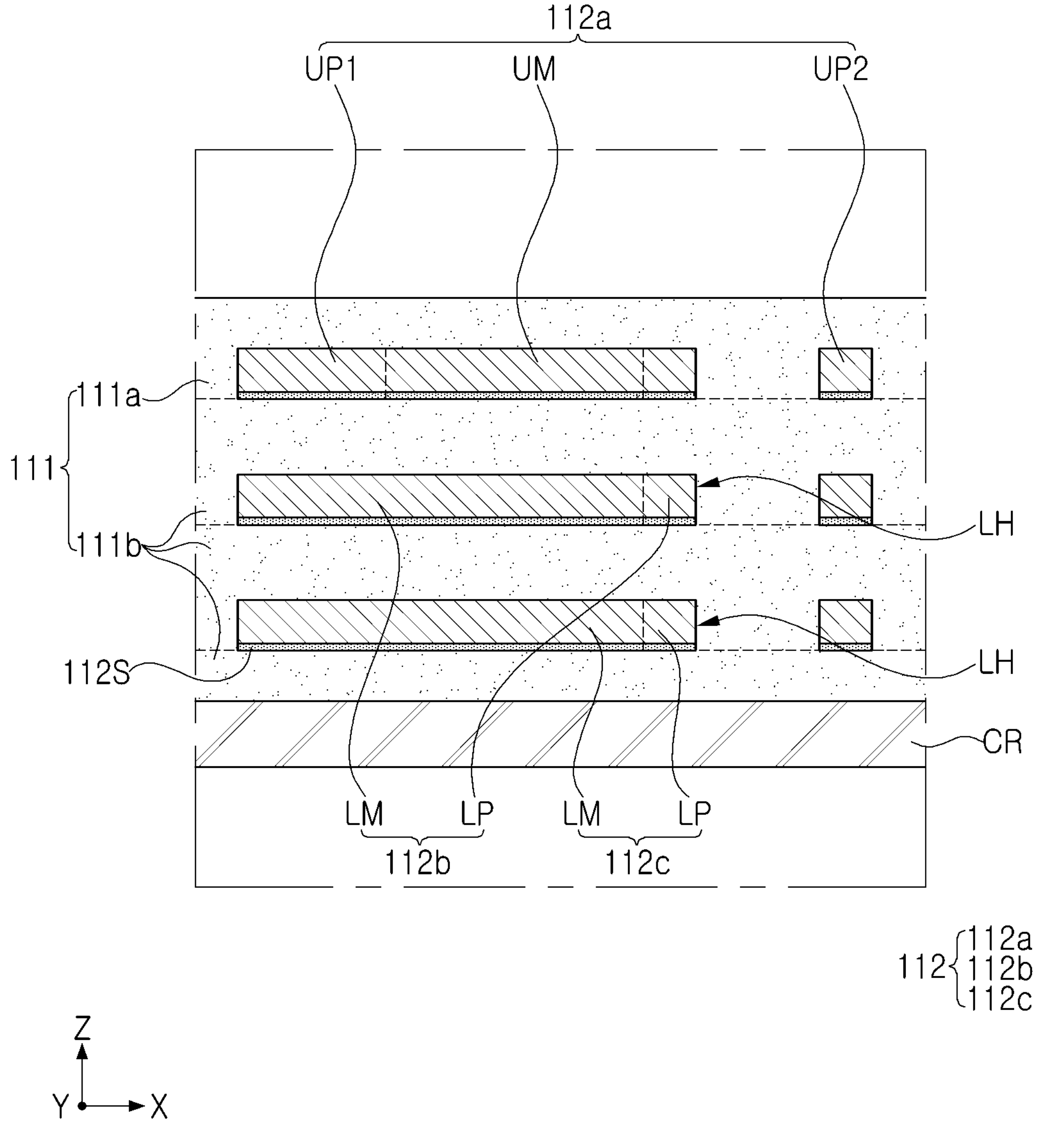

Referring to FIG. 3C, an uppermost insulating layer 111*a* may be formed on the upper redistribution layer 112*a* and the internal insulating layer 111*b*. The uppermost insulating layer 111*a* may include a material, different from a material of the internal insulating layer 111*b*. In an embodiment, the uppermost insulating layer 111*a* may include a photosensitive insulating resin. For example, the uppermost insulating layer 111*a* may include a photoimageable dielectric (PID). The uppermost insulating layer 111*a* may cover the upper redistribution layer 112*a*.

Figure 3D:
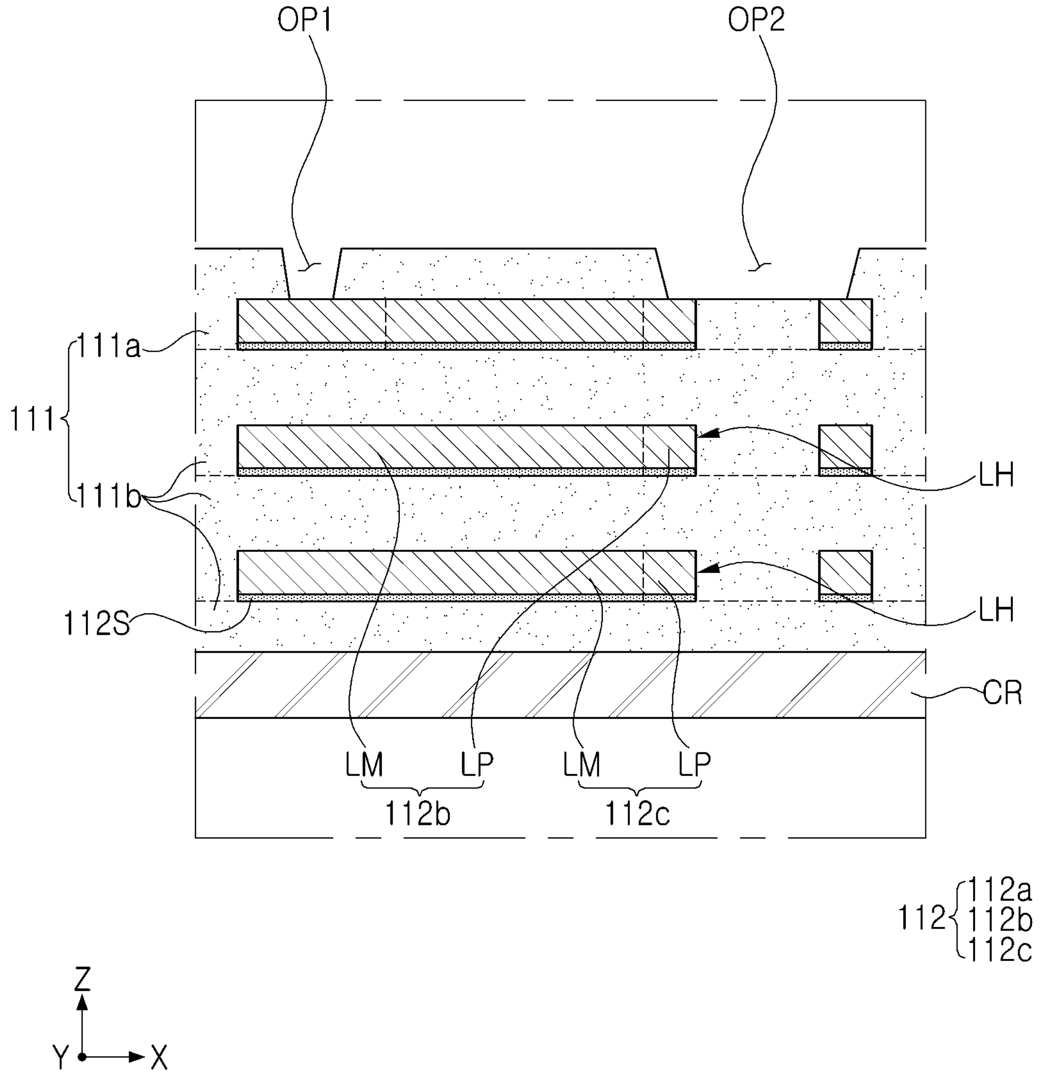

Referring to FIG. 3D, a first opening OP1 and a second opening OP2 may be formed by removing a portion of the uppermost insulating layer 111*a*. The first opening OP1 and the second opening OP2 may be formed using a photolithography process.

The first opening OP1 may be formed on the first upper pad portion UP1 of the upper redistribution layer 112*a*. The first opening OP1 may be formed in a shape tapered toward a lower surface of the redistribution substrate 110. The second opening OP2 may be formed on the second upper pad portion UP2 of the upper redistribution layer 112*a*. The second opening OP2 may be formed in a shape tapered toward the lower surface of the redistribution substrate 110. A width of a cross-section of the second opening OP2 may be equal to or greater than a width of a cross-section of the first opening OP1.

Figure 3E:
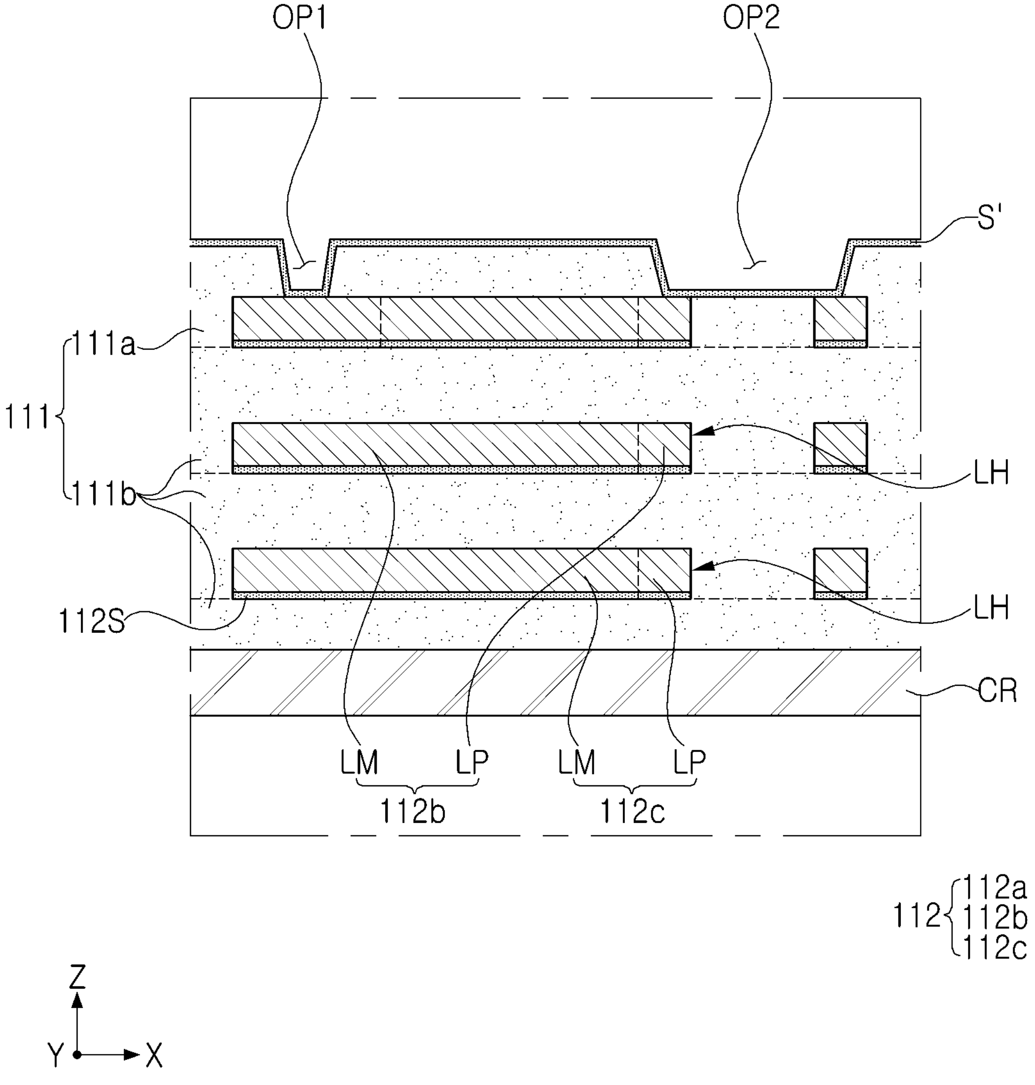

Referring to FIG. 3E, a first preliminary seed layer S' may be formed along an upper surface of the redistribution substrate 110 and along the first opening OP1 and the second opening OP2. The first preliminary seed layer S' may be formed using a plating process, a deposition process, or the like. The first preliminary seed layer S' may include a metal material such as titanium (Ti) or copper (Cu). The first preliminary seed layer S' may extend beyond a region illustrated in FIG. 3E.

Figure 3F:
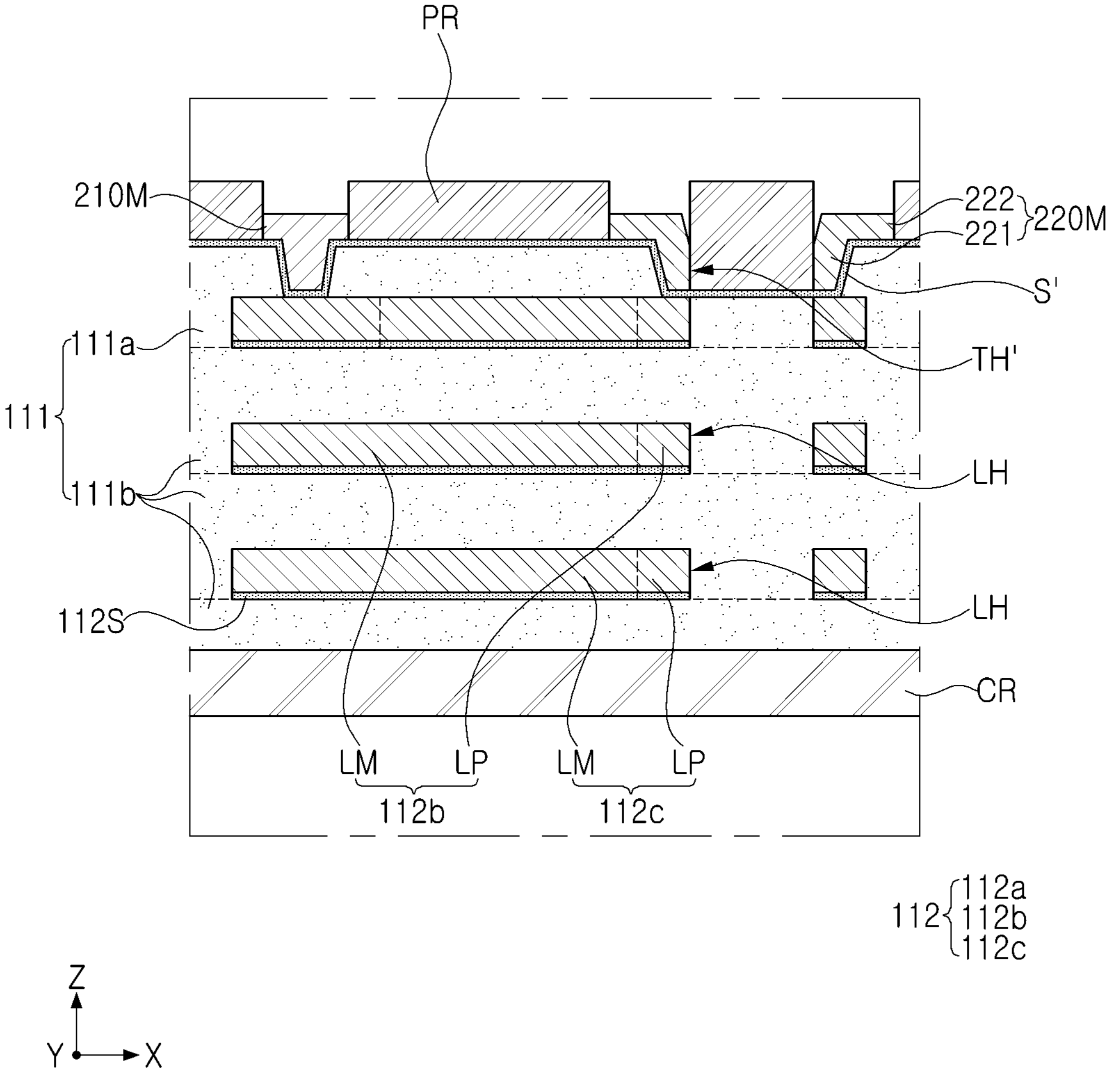

Referring to FIG. 3F, first and second plating layers 210M and 220M may be formed using a patterned photoresist layer PR on the first preliminary seed layer S'. The photoresist layer PR may be formed on the first preliminary seed layer S'.

The first plating layer 210M may be formed on the first preliminary seed layer S' according to a position of the photoresist layer PR. The first plating layer 210M may have a shape tapered toward the lower surface of the redistribution substrate according to a shape of the first opening OP1. At least a portion of a side surface of the first plating layer 210M may be in contact with the photoresist layer PR. A plurality of plating layers having the same shape as the first plating layer 210M may be formed in a region (not illustrated in the drawings).

The second plating layer 220M may be formed on the first preliminary seed layer S' according to a position of the photoresist layer PR. The second plating layer 220M may include a first portion 221 located on a level, lower than the upper surface of the redistribution substrate 110, and a second portion 222 located on a level, higher than the upper surface of the redistribution substrate 110. A preliminary through-hole TH' defined by an internal side wall of the second plating layer 220M may exist in a central portion of the second plating layer 220M. A diameter of the preliminary through-hole TH' may be equal to or greater than a diameter of an upper hole UH.

Figure 3G:
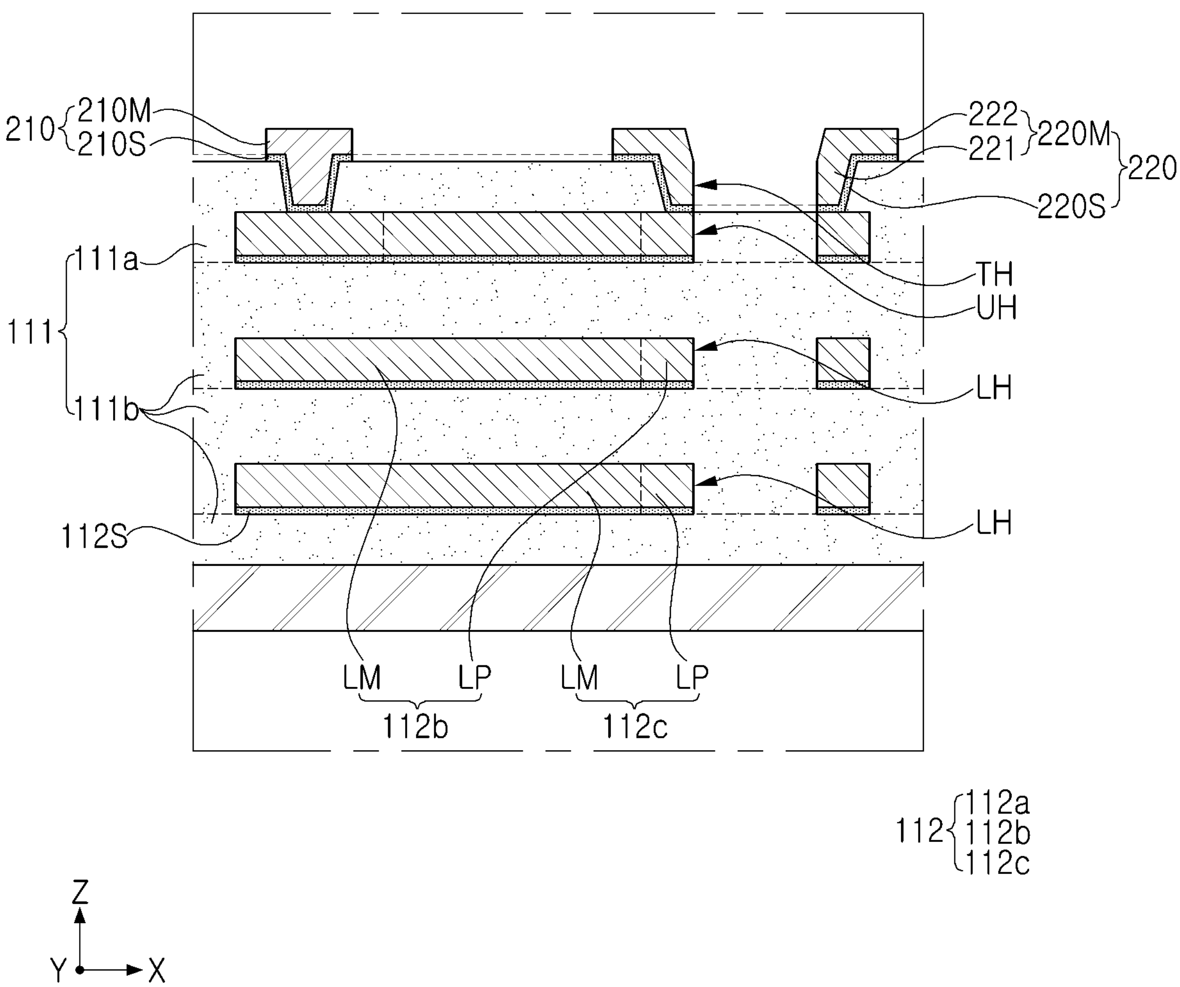

Referring to FIG. 3G, a first pad structure 210 and a second pad structure 220 may be formed by removing the photoresist layer PR and partially etching the first preliminary seed layer S'. As the photoresist layer PR is removed, side surfaces of the first pad structure 210 and side surfaces of the second pad structure 220 may be exposed. A through-hole TH may exist in a central portion of the second pad structure 220. A diameter of the through-hole TH may be equal to or greater than the diameter of the upper hole UH. In addition, as a portion of the first preliminary seed layer S' exposed from the plating layers 210M and 220M is removed, a seed layer 210S for the first pad structure 210 and a seed layer 220S for the second pad structure 220 may be formed. As a portion of the first preliminary seed layer S' is removed, a portion of the uppermost insulating layer 111*a* below the removed portion may be exposed.

Figure 3H:
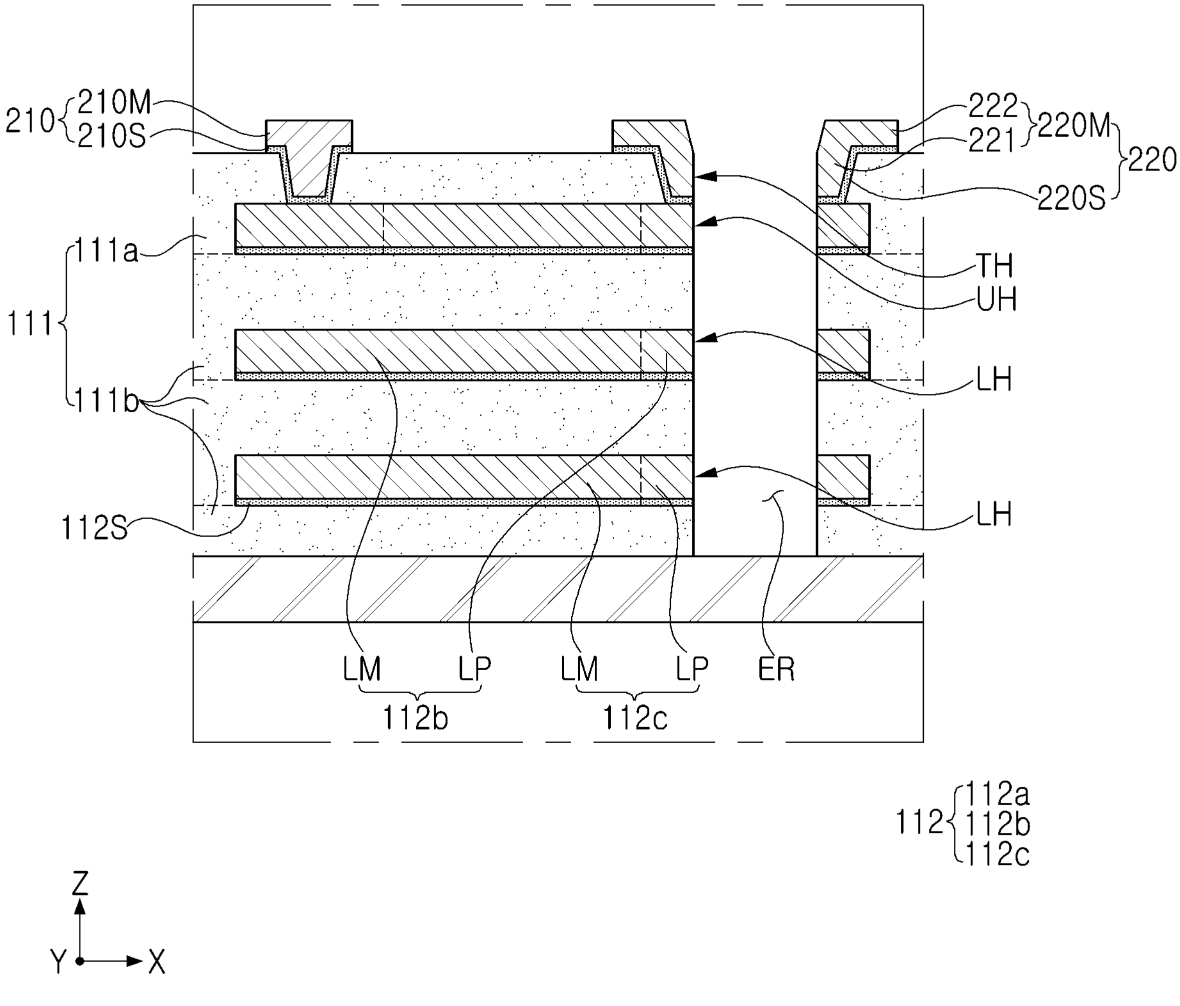

Referring to FIG. 3H, an etched region ER vertically extending through the through-hole TH, the upper hole UH, and the lower hole LH may be formed. The etched region ER may be formed by removing a portion of the internal insulating layer 111*b* by a dry etching process. In the etched region ER, an upper width may be equal to or wider than a lower width. As the etched region ER is formed, a portion of the plurality of redistribution layers 112 and a portion of the insulating layer 111 may be exposed.

Figure 3I:
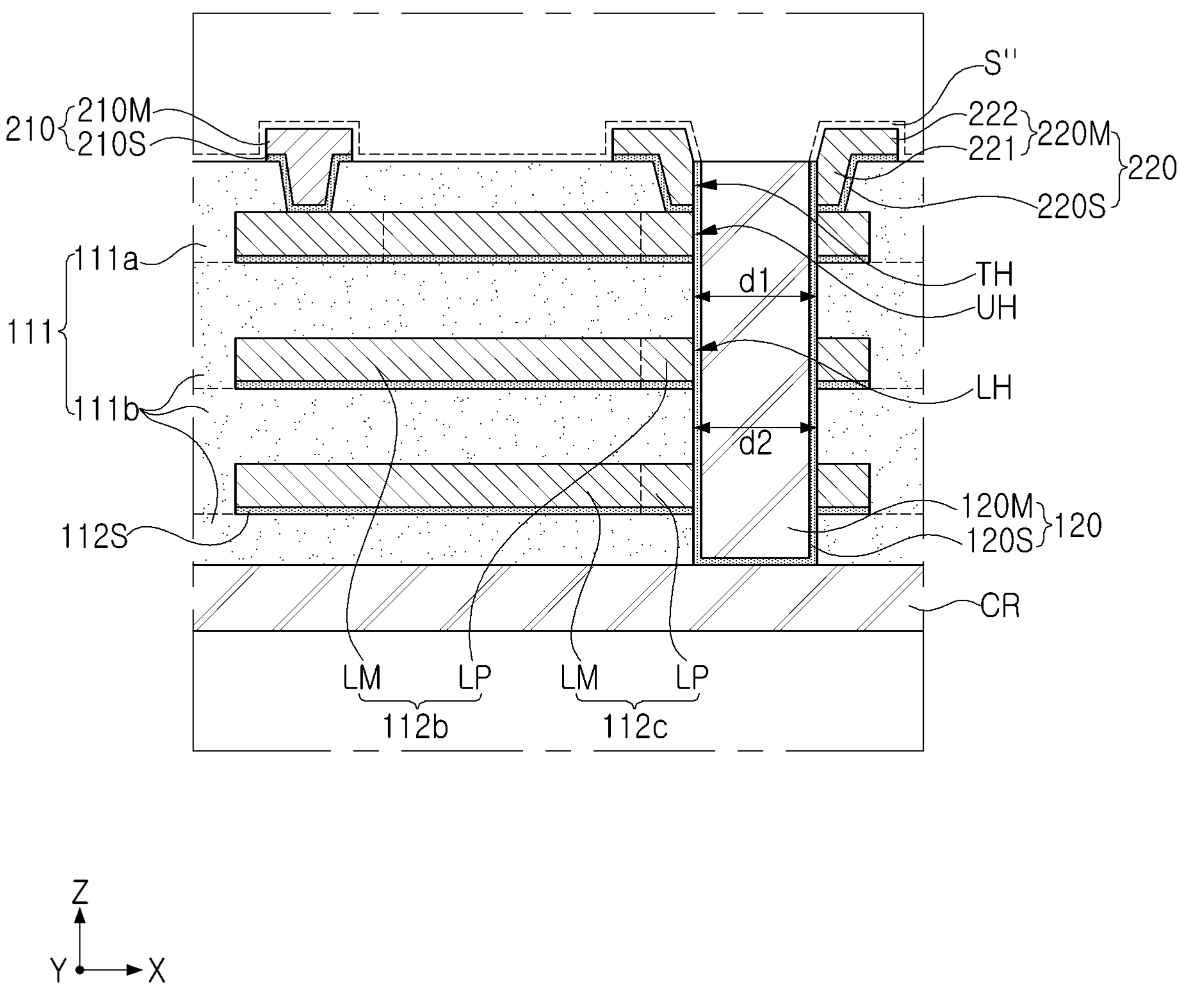

Referring to FIG. 3I, a through-via 120 may be formed in the etched region ER. The through-via 120 may include a barrier layer 120S and a conductive electrode 120M.

The barrier layer 120S may be formed by etching a portion of a second preliminary seed layer S" along an internal wall of the etched region ER. Depending on an embodiment, an uppermost end of the barrier layer 120S may be located on a level, lower than an uppermost end of the conductive electrode 120M. The second preliminary seed layer S" may be etched by a wet etching process, after removing a resist layer for plating the conductive electrode 120M. The second preliminary seed layer S" may be formed along the upper surface of the redistribution substrate 110, a surface of the first pad structure 210, a surface of the second pad structure 220, and a sidewall of the etched region ER. The barrier layer 120S may be in direct contact with the redistribution layers 112*a*, 112*b*, and 112*c* and a surface of the insulating layer 111 exposed in the etched region ER. The barrier layer 120S may include at least one of titanium (Ti), a titanium (Ti) alloy, copper (Cu), or a copper (Cu) alloy.

The conductive electrode 120M may be formed on the second preliminary seed layer S" in the etched region ER. The conductive electrode 120M may include at least one of copper (Cu) or a copper (Cu) alloy, to electrically connect the plurality of redistribution layers 112 to each other. However, it is not limited thereto, and may include other metal materials. The conductive electrode 120M may include the same material as the plurality of redistribution layers 112.

The through-via 120 may include a first region contacting the internal insulating layer 111*b* below the upper redistribution layer 112*a*, and a second region contacting the internal insulating layer 111*b* below the lower redistribution layer 112*b*. A width d1 of the first region may be substantially equal to a width d2 of the second region. The width d1 of the first region may be equal to a width of the upper hole UH, and the width d2 of the second region may be equal to a width of the lower hole LH.

Figure 4:
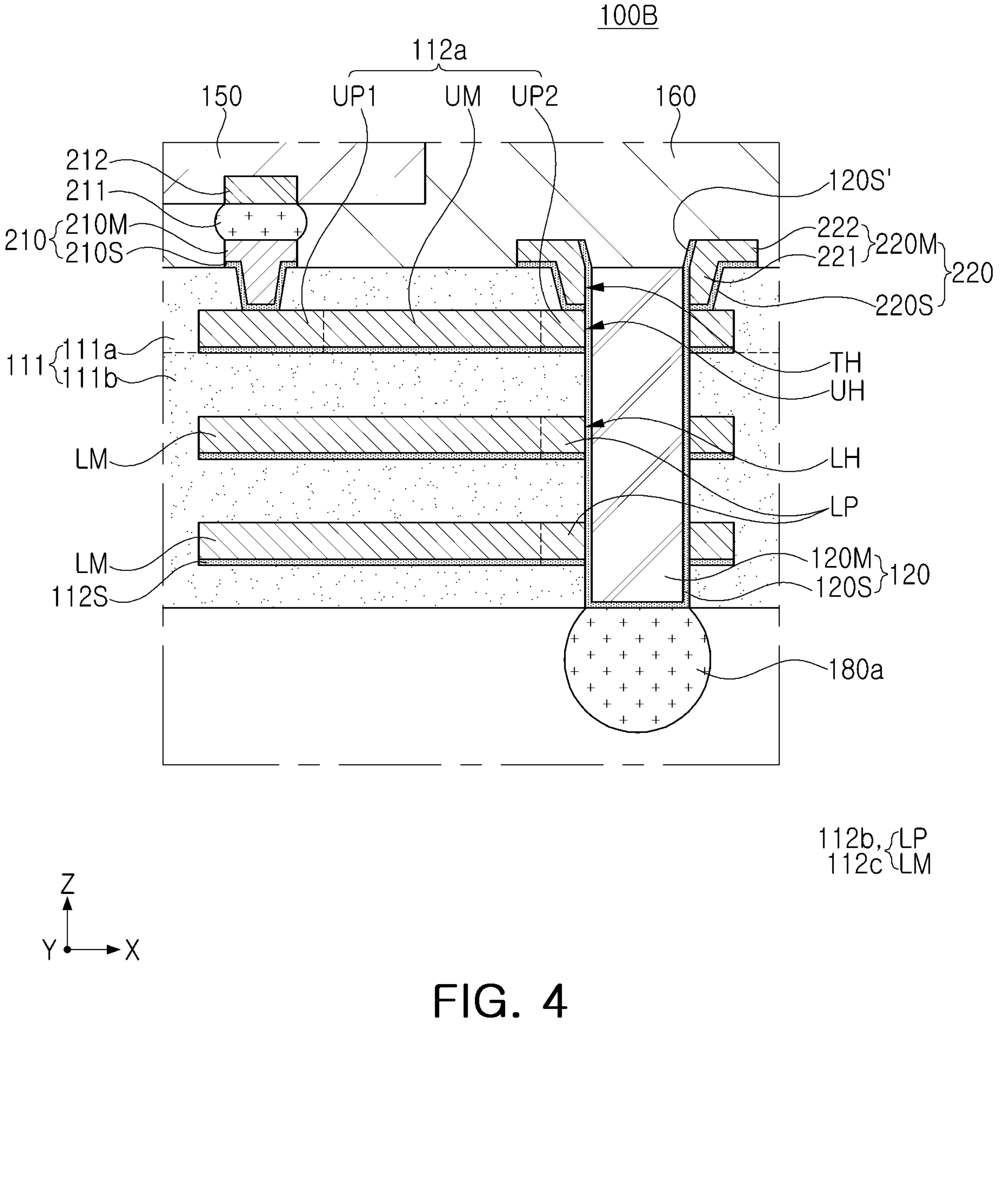
FIG. 4 is a partially enlarged view illustrating a portion corresponding to portion 'A' of FIG. 1A in a semiconductor package according to an embodiment.

FIG. 4 is a partially enlarged view illustrating a portion corresponding to portion 'A' of FIG. 1A in a semiconductor package 100B according to an embodiment.

Referring to FIG. 4, in a semiconductor package 100B of an embodiment, a barrier layer 120S of a through-via 120 may include an extension portion 120S' extending along an internal wall of a through-hole TH of a second pad structure, over an upper end of a conductive electrode. As described above, the barrier layer 120S may be removed by a wet etching process, after forming a conductive electrode 120M. The extension portion 120S' may be a remaining region protruding from an upper surface of a redistribution substrate 110 in a process of removing a second preliminary seed layer (S" in FIG. 3I). Other portions may have the same characteristics as the semiconductor package 100A illustrated in FIG. 1A.

Figure 5A:
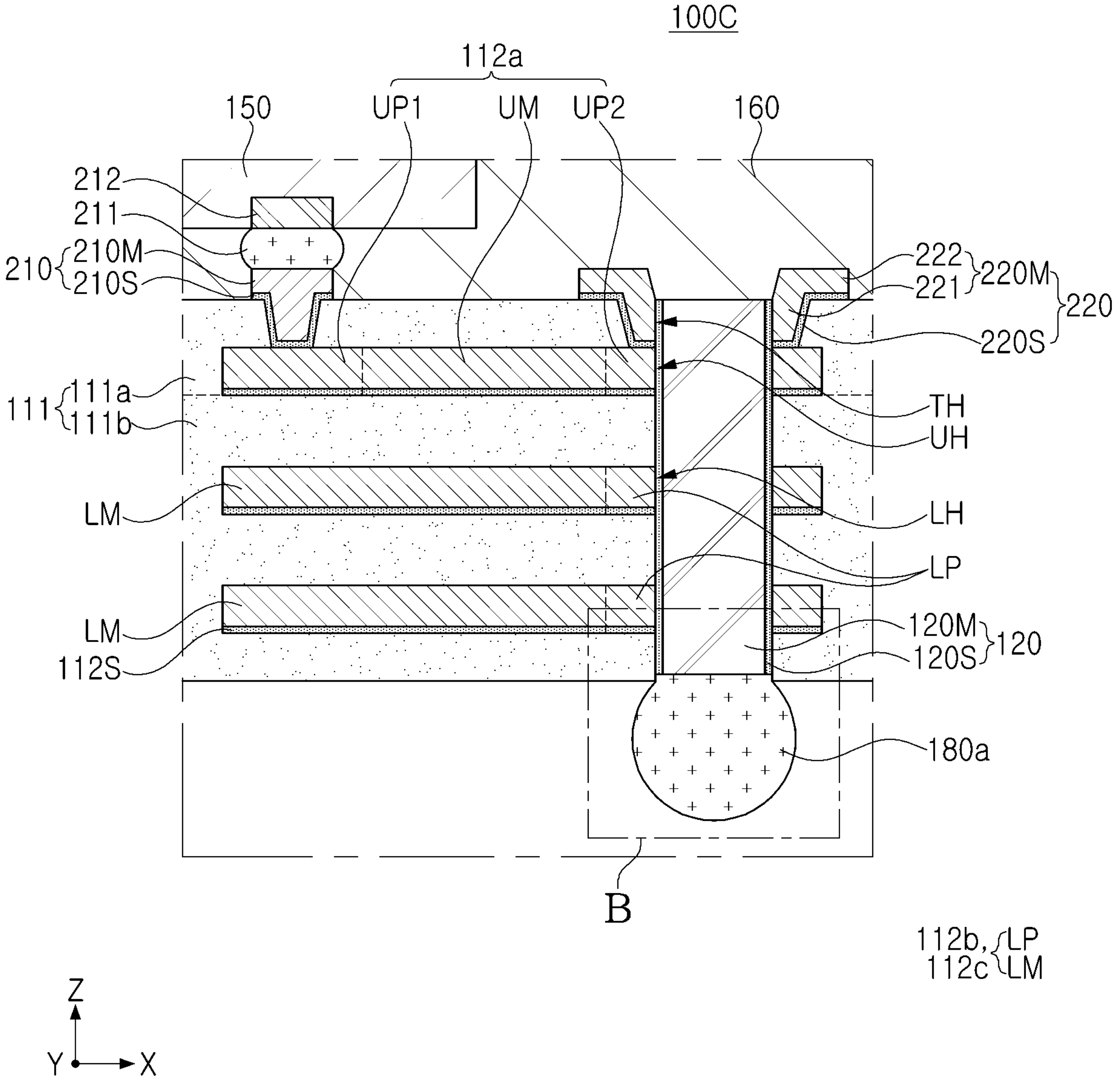
FIG. 5A is a partially enlarged view illustrating a portion corresponding to portion 'A' of FIG. 1A in a semiconductor package according to an embodiment.
Figure 5B:
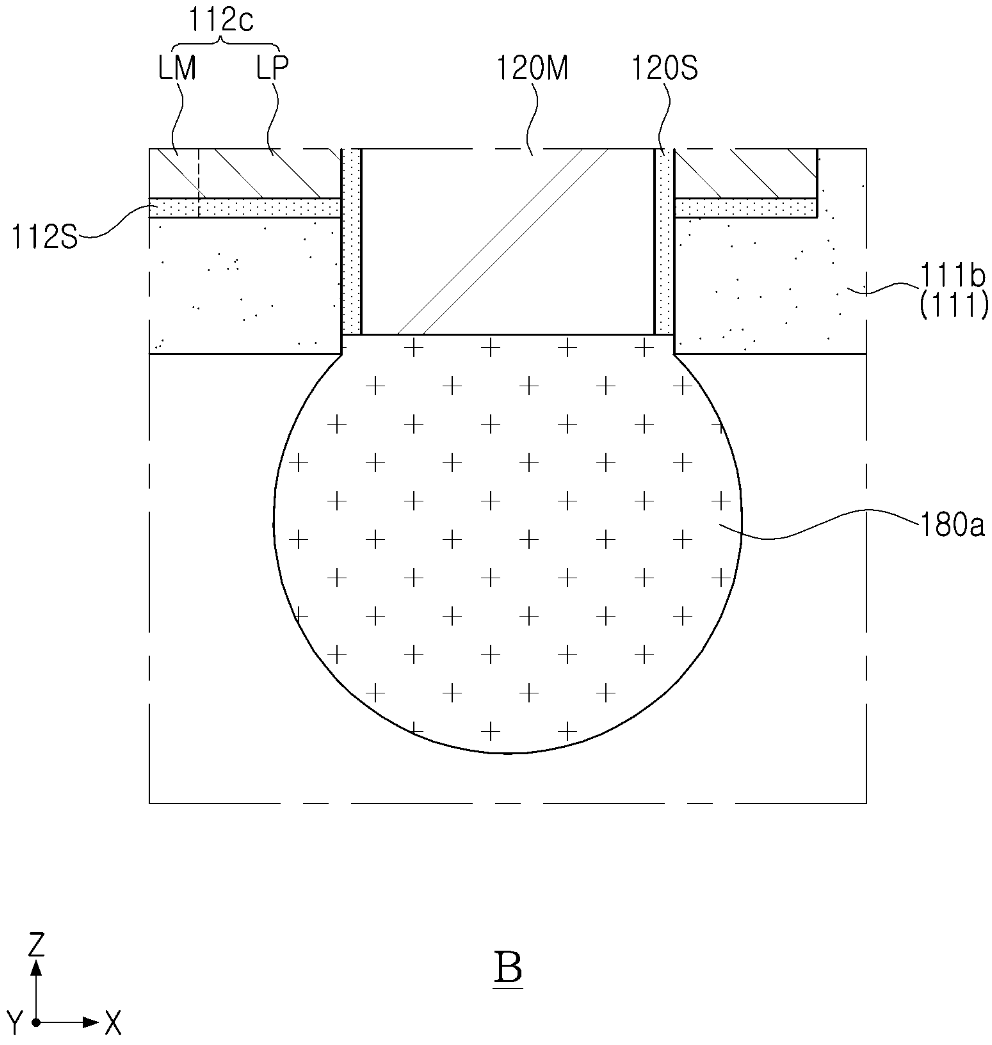
FIG. 5B is a partially enlarged view illustrating portion 'B' of FIG. 5A.

FIG. 5A is a partially enlarged view illustrating a portion corresponding to portion 'A' of FIG. 1A in a semiconductor package 100C according to an embodiment, and FIG. 5B is a partially enlarged view illustrating portion 'B' of FIG. 5A.

Referring to FIGS. 5A and 5B, in a semiconductor package 100C according to an embodiment, a lower surface of a conductive electrode 120M may be exposed from a barrier layer 120S. The lower surface of the conductive electrode 120M may have a step difference with a lower surface of an insulating layer 111 (or a lower surface of a redistribution substrate 110). The lower surface of the conductive electrode 120M may be on a level, higher than the lower surface of the insulating layer 111 (or the lower surface of the redistribution substrate 110). The lower surface of the conductive electrode 120M may be exposed by removing a portion of the barrier layer 120S. A step difference between the lower surface of the conductive electrode 120M and the lower surface of the insulating layer 111 may correspond to a thickness of a removed portion of the barrier layer 120S.

A first connection bump 180*a* may be electrically connected to a lower surface of a through-via 120. As illustrated in FIG. 5B, the first connection bump 180*a* may be directly connected to the lower surface of the through-via 120, and may fill the step difference on the lower surface of the conductive electrode 120M. Other portions may have the same characteristics as the semiconductor package 100A illustrated in FIGS. 1A and 1B.

Figure 6:
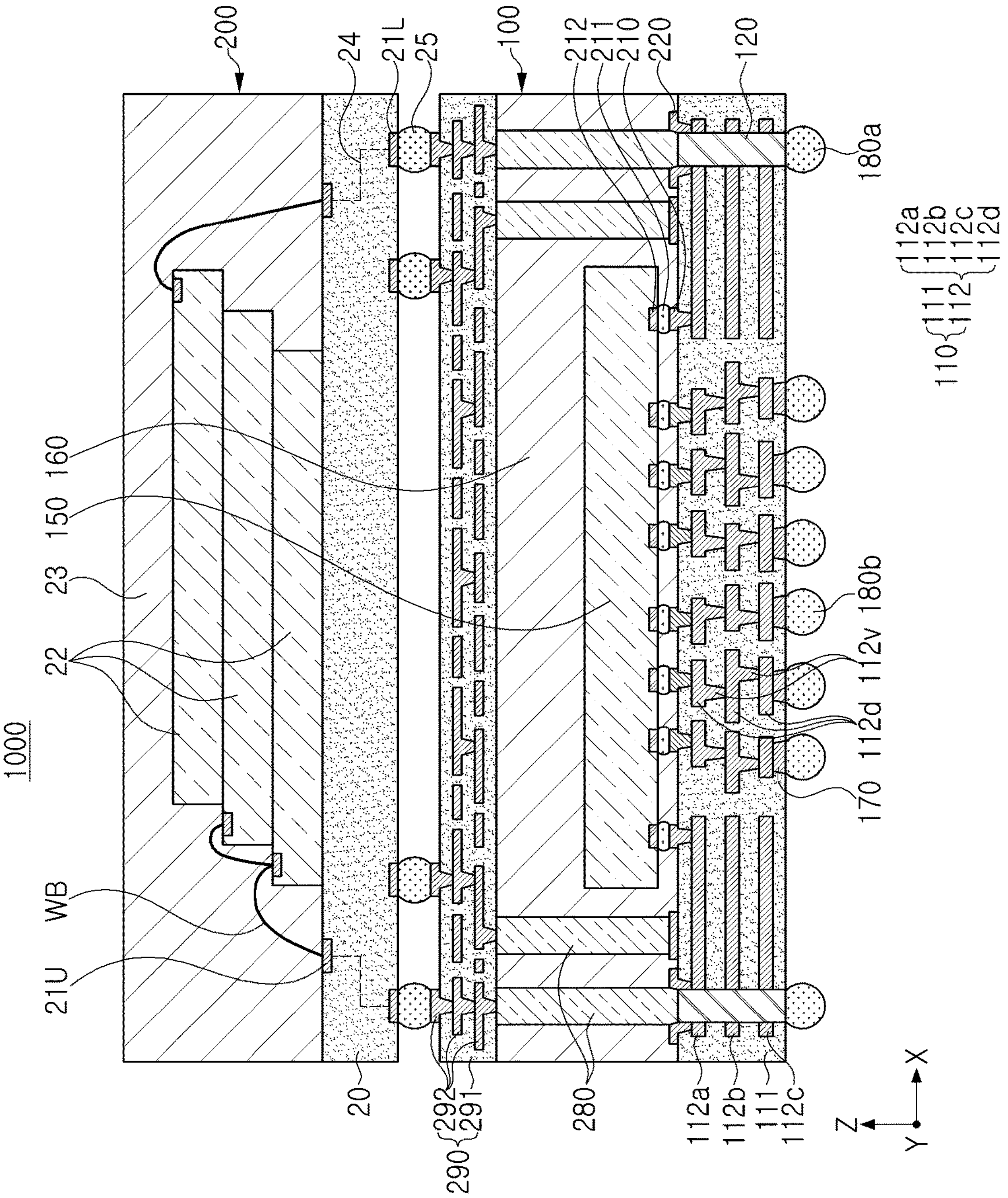
FIG. 6 is a cross-sectional view illustrating a semiconductor package according to an embodiment.

FIG. 6 is a cross-sectional view illustrating a semiconductor package 1000 according to an embodiment.

Referring to FIG. 6, a semiconductor package 1000 according to an embodiment may include a first package 100 and a second package 200. The first package 100 may be replaced with the semiconductor packages 100A, 100B, and 100C described with reference to FIGS. 1A to 5B or semiconductor packages having similar characteristics thereto, except that the first package 100 further includes a conductive post 280 and a redistribution member 290.

The conductive post 280 may pass through an encapsulant 160, and may electrically connect a redistribution substrate 110 and the redistribution member 290. The conductive post 280 may include at least one of copper (Cu) or a copper (Cu) alloy. A seed layer (not illustrated) may be below the conductive post 280. The seed layer (not illustrated) may include at least one of titanium (Ti), a titanium (Ti) alloy, copper (Cu), or a copper (Cu) alloy.

The redistribution member 290 may include an insulating member 291 and interconnection layers 292. The insulating member 291 may include a thermosetting resin such as epoxy resin, a thermoplastic resin such as polyimide, a prepreg impregnated with an inorganic filler, or a photosensitive resin such as ABF, FR-4, BT, or PID. The interconnection layers 292 may include, for example, a metal material including copper (Cu), aluminum (Al), silver (Ag), tin (Sn), gold (Au), nickel (Ni), lead (Pb), titanium (Ti), or an alloy thereof.

The second package 200 may include a redistribution substrate 20, a second semiconductor chip 22, and a second encapsulant 23. The redistribution substrate 20 may include a lower pad 21L and an upper pad 21U, on lower and upper surfaces thereof, electrically connected to an external source, respectively. Also, the redistribution substrate 20 may include a redistribution circuit 24 electrically connecting the lower pad 21L and the upper pad 21U.

The second semiconductor chip 22 may be mounted on the redistribution substrate 20 by wire bonding or flip chip bonding. For example, a plurality of second semiconductor chips 22 may be vertically stacked on the redistribution substrate 20, and may be electrically connected to the upper pad 21U of the redistribution substrate 20 by a bonding wire WB. In an example, the second semiconductor chip 22 may include a memory chip, and a first semiconductor chip 150 may include an AP chip.

The second encapsulant 23 may include the same or similar material as the encapsulant 160 of the first package 100. The second package 200 may be physically and electrically connected to the first package 100 by a conductive bump 25. The conductive bump 25 may be electrically connected to the redistribution circuit 24 in the redistribution substrate 20 through the lower pad 21L of the redistribution substrate 20. The conductive bump 25 may include a low melting point metal, for example, tin (Sn) or an alloy containing tin (Sn).

Figure 7:
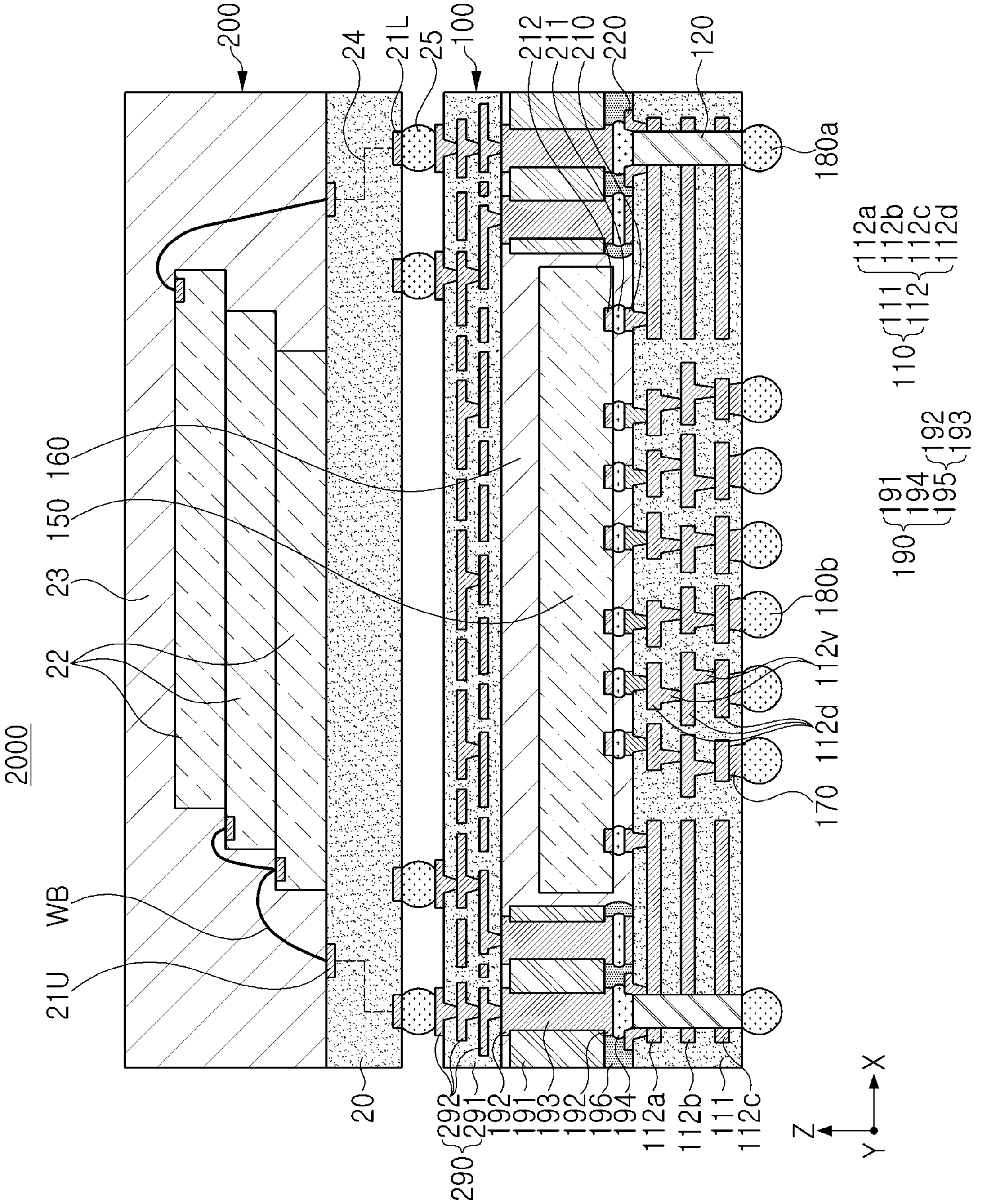
FIG. 7 is a cross-sectional view illustrating a semiconductor package according to an embodiment.

FIG. 7 is a cross-sectional view illustrating a semiconductor package 2000 according to an embodiment.

Referring to FIG. 7, a semiconductor package 2000 according to an embodiment may have the same or similar characteristics as the semiconductor package described with reference to FIG. 6, except for a first package 100 further including a connection member 190 and a redistribution member 290.

The connection member 190 may include a frame insulating layer 191 and a connection conductor 195 extending through the frame insulating layer 191.

The frame insulating layer 191 may include an insulating resin. The frame insulating layer 191 may include an insulating resin. The insulating resin may include a thermosetting resin, a thermoplastic resin, a prepreg, ABF, FR-4, BT, or the like.

The connection conductor 195 may include an interconnection pad 192 and an interconnection via 193 extending through the frame insulating layer 191, on upper and lower surfaces of the frame insulating layer 191. The interconnection pad 192 may include a metal material, and may include the same material as a plurality of redistribution layers 112 of a redistribution substrate 110. The connection conductor 195 may be electrically connected to the plurality of redistribution layers 112 through a lower connection conductor 194. Depending on an embodiment, the connection conductor 195 may be connected to a second pad structure 220. An insulating film layer 196 surrounding (e.g., on side surface of) the lower connection conductor 194 may be between the connection member 190 and the redistribution substrate 110. The insulating film layer 196 may be, for example, an insulating material layer such as a non-conductive film (NCF).

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a redistribution substrate having an upper surface and an opposing lower surface, the redistribution substrate including a plurality of redistribution layers in an insulating layer, the plurality of redistribution layers including an upper redistribution layer adjacent to the upper surface and a lower redistribution layer below the upper redistribution layer;

a first pad structure on the upper surface of the redistribution substrate and connected to one side of the upper redistribution layer;

a second pad structure on the upper surface of the redistribution substrate and connected to another side of the upper redistribution layer;

a through-via extending from the upper surface to the lower surface of the redistribution substrate and electrically connecting the second pad structure and the plurality of redistribution layers; and a semiconductor chip on the redistribution substrate and electrically connected to the first pad structure, wherein the upper redistribution layer includes an upper pattern portion, a first upper pad portion connected to the first pad structure on a first end of the upper pattern portion, and a second upper pad portion connected to a second end of the upper pattern portion and having an upper hole through which the through-via extends, the lower redistribution layer includes a lower pattern portion and a lower pad portion on at least one end of the lower pattern portion and having a lower hole through which the through-via extends, and the second pad structure includes a through-hole aligned with the upper hole and the lower hole in a vertical direction and through which the through-via extends.

2. The semiconductor package of claim 1, wherein the insulating layer comprises an uppermost insulating layer adjacent the upper surface of the redistribution substrate and an internal insulating layer below the uppermost insulating layer, wherein a material of the uppermost insulating layer and a material of the internal insulating layer are different.

3. The semiconductor package of claim 2, wherein the internal insulating layer comprises a non-photosensitive resin, and the uppermost insulating layer comprises a photosensitive resin.

4. The semiconductor package of claim 1, wherein the first upper pad portion has a circular cross-sectional shape, and the second upper pad portion has a ring cross-sectional shape defining the upper hole.

5. The semiconductor package of claim 1, wherein the lower pad portion has a ring cross-sectional shape defining the lower hole.

6. The semiconductor package of claim 1, wherein a diameter of the second upper pad portion is greater than a diameter of the first upper pad portion.

7. The semiconductor package of claim 1, wherein a diameter of the through-hole is equal to or greater than a diameter of the upper hole and a diameter of the lower hole.

8. The semiconductor package of claim 1, wherein the redistribution substrate further comprises a redistribution via connecting vertically adjacent redistribution layers of the plurality of redistribution layers, wherein the redistribution via has a shape tapered toward the lower surface.

9. The semiconductor package of claim 1, wherein a width of the second pad structure is greater than a width of the first pad structure.

10. The semiconductor package of claim 1, wherein a width of a first region of the through-via contacting the insulating layer below the upper redistribution layer is substantially equal to a width of a second region of the through-via contacting the insulating layer below the lower redistribution layer.

11. The semiconductor package of claim 10, wherein the width of the first region is equal to a width of the upper hole of the upper redistribution layer, and the width of the second region is equal to a width of the lower hole of the lower redistribution layer.

12. The semiconductor package of claim 1, wherein the second pad structure comprises a first portion located on a level, lower than the upper surface of the redistribution substrate, and a second portion located on a level, higher than the upper surface of the redistribution substrate, wherein an internal side wall of the first portion is perpendicular to the upper surface of the redistribution substrate, and an internal side wall of the second portion is inclined with respect to the upper surface of the redistribution substrate.

13. The semiconductor package of claim 1, wherein the second pad structure is spaced apart from the semiconductor chip and the first pad structure.

14. A semiconductor package comprising:

a redistribution substrate having an upper surface and an opposing lower surface, the redistribution substrate including external redistribution layers and internal redistribution layers;

a semiconductor chip on the upper surface of the redistribution substrate and electrically connected to the external redistribution layers and the internal redistribution layers;

a pad structure on the upper surface of the redistribution substrate and spaced apart from the semiconductor chip, the pad structure being electrically connected to the external redistribution layers;

a through-via vertically extending through the pad structure and the external redistribution layers; and an encapsulant on at least a portion of the semiconductor chip, at least a portion of the pad structure, and at least a portion of the through-via on the upper surface of the redistribution substrate.

15. The semiconductor package of claim 14, further comprising:

lower pad structures electrically connected to the internal redistribution layers and exposed to the lower surface of the redistribution substrate; and a first connection bump on a lower surface of the through-via, and a second connection bump on a lower surface of one of the lower pad structures.

16. The semiconductor package of claim 14, wherein the redistribution substrate has a fan-in region overlapping the semiconductor chip and a fan-out region that does not overlap the semiconductor chip, wherein the through-via is in the fan-out region.

17. A semiconductor package comprising:

a redistribution substrate including a plurality of redistribution layers;

a semiconductor chip on the redistribution substrate and electrically connected to the plurality of redistribution layers;

a pad structure on the redistribution substrate spaced apart from the semiconductor chip; and a through-via including a conductive electrode in an etched region extending through both the pad structure and the plurality of redistribution layers, and a barrier layer surrounding a side surface of the conductive electrode, wherein a width of an upper portion of the through-via is substantially equal to a width of a lower portion of the through-via.

18. The semiconductor package of claim 17, wherein the barrier layer comprises at least one of titanium (Ti), a titanium (Ti) alloy, copper (Cu), or a copper (Cu) alloy, and the conductive electrode comprises at least one of copper (Cu) or a copper (Cu) alloy.

19. The semiconductor package of claim 17, wherein an upper end of the barrier layer is on a level, higher than an upper surface of the conductive electrode.

20. The semiconductor package of claim 17, wherein a portion of the barrier layer is removed to expose a lower surface of the conductive electrode.

* * * * *